US011002968B2

(12) United States Patent
Ouderkirk et al.

(10) Patent No.: US 11,002,968 B2
(45) Date of Patent: May 11, 2021

(54) COLOR FOVEATED DISPLAY DEVICES AND METHODS OF MAKING THE SAME

(71) Applicant: Facebook Technologies, LLC, Menlo Park, CA (US)

(72) Inventors: Andrew John Ouderkirk, Redmond, WA (US); James Hillis, Redmond, WA (US); Marina Zannoli, Redmond, WA (US); Jasmine Soria Sears, Kirkland, WA (US); James Ronald Bonar, Redmond, WA (US); Gareth Valentine, Redmond, WA (US); Barry David Silverstein, Kirkland, WA (US); Warren Andrew Hunt, Woodinville, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 145 days.

(21) Appl. No.: 16/179,752

(22) Filed: Nov. 2, 2018

(65) Prior Publication Data
US 2020/0132992 A1    Apr. 30, 2020

Related U.S. Application Data

(63) Continuation of application No. 16/171,135, filed on Oct. 25, 2018.

(51) Int. Cl.
*G02B 27/14*    (2006.01)
*G03H 1/00*    (2006.01)
(Continued)

(52) U.S. Cl.
CPC ..... *G02B 27/0172* (2013.01); *G02B 27/0101* (2013.01); *G02B 27/017* (2013.01);
(Continued)

(58) Field of Classification Search
CPC .............. G02B 27/0172; G02B 27/145; G02B 27/0149; G02B 27/0101; G02B 26/001;
(Continued)

(56) References Cited

U.S. PATENT DOCUMENTS 8,520,150 B2    8/2013    Yokota
10,453,828 B1    10/2019    Ouderkirk
(Continued)

OTHER PUBLICATIONS

Anonymous, "Pulse-Amplitude-Modulation Drive Control of LEDs," Jul. 2, 2002, ip.com Journal, ip.com Inc, West Henrietta, NY, XP013003659, ISSN: 1533-0001, 13 pgs.
(Continued)

*Primary Examiner* — Dawayne Pinkney
(74) *Attorney, Agent, or Firm* — Morgan, Lewis & Bockius LLP

(57) ABSTRACT

A display device includes a display panel having a first emission region and one or more second emission regions disposed adjacent to the first emission region. The display device includes a plurality of light emitters, arranged in the first emission region, corresponding to a first color gamut and a plurality of light emitters, arranged in the one or more second emission regions, corresponding to a second color gamut that is distinct from the first color gamut. A method for making a display device with a plurality of light emitters corresponding to a first color gamut in a first emission region and a plurality of light emitters corresponding to a second color gamut in a second emission region is also described.

19 Claims, 25 Drawing Sheets

(51) Int. Cl.
*G02F 1/03* (2006.01)
*G02B 27/10* (2006.01)
*G09G 5/00* (2006.01)
*G02F 1/1335* (2006.01)
*G02B 27/01* (2006.01)
*H01L 27/15* (2006.01)
*G09G 5/02* (2006.01)

(52) U.S. Cl.
CPC ........ *G02B 27/0179* (2013.01); *H01L 27/156* (2013.01); *G02B 2027/0112* (2013.01); *G02B 2027/0118* (2013.01); *G02B 2027/0123* (2013.01); *G02B 2027/0178* (2013.01); *G02B 2027/0187* (2013.01); *G09G 5/026* (2013.01); *G09G 2320/0686* (2013.01); *G09G 2330/021* (2013.01); *G09G 2354/00* (2013.01)

(58) Field of Classification Search
CPC ................ G02B 27/017; G02B 27/144; G02B 27/1013; G02B 27/0103; G02B 5/005; G02B 26/0841; G03G 13/22; G03G 17/04
USPC ... 359/634, 618, 630–636, 639, 13–14, 237, 359/245–247, 265, 296, 253, 290, 298; 345/7–9, 632–633, 207, 49, 105, 107; 349/11, 33; 430/31–32
See application file for complete search history.

(56) References Cited

U.S. PATENT DOCUMENTS

| | | |
|---|---|---|
| 2003/0210222 A1 | 11/2003 | Ogiwara et al. |
| 2008/0297604 A1* | 12/2008 | Imai ..................... H04N 17/02 348/181 |
| 2013/0063557 A1 | 3/2013 | Saigo et al. |
| 2015/0116388 A1 | 4/2015 | Asanuma et al. |
| 2017/0103697 A1* | 4/2017 | Kawashima ......... G09G 3/2074 |
| 2017/0285344 A1 | 10/2017 | Benko et al. |
| 2017/0290098 A1 | 10/2017 | Kautzsch et al. |
| 2018/0045385 A1 | 2/2018 | Tyukhova et al. |
| 2018/0047325 A1 | 2/2018 | Biwa et al. |
| 2018/0137602 A1 | 5/2018 | Spitzer et al. |
| 2018/0269266 A1 | 9/2018 | Cancel Olmo et al. |
| 2018/0335668 A1 | 11/2018 | Fan et al. |
| 2020/0052045 A1 | 2/2020 | Kuo et al. |

OTHER PUBLICATIONS

Facebook Technologies Inc., International Search Report and Written Opinion, PCT/US2019/058128, dated Apr. 3, 2020, 21 pgs.
Ouderkirk, Office Action, U.S. Appl. No. 16/006,734, dated Mar. 13, 2019, 13 pgs.
Ouderkirk, Notice of Allowance, U.S. Appl. No. 16/006,734, dated Jul. 10, 2019, 5 pgs.
Ouderkirk, Office Action, U.S. Appl. No. 16/557,838, dated Apr. 14, 2020, 18 pgs.
Ouderkirk, Notice of Allowance, U.S. Appl. No. 16/557,838, dated Jul. 27, 2020, 5 pgs.
Ouderkirk, Notice of Allowance, U.S. Appl. No. 16/530,678, dated Oct. 28, 2020. 10 pgs.
Ouderkirk, Office Action, U.S. Appl. No. 16/171,135, dated Feb. 10, 2021, 10 pgs.
Ouderkirk, Office Action, U.S. Appl. No. 16/785,258, dated Feb. 18, 2021, 12 pgs.

* cited by examiner

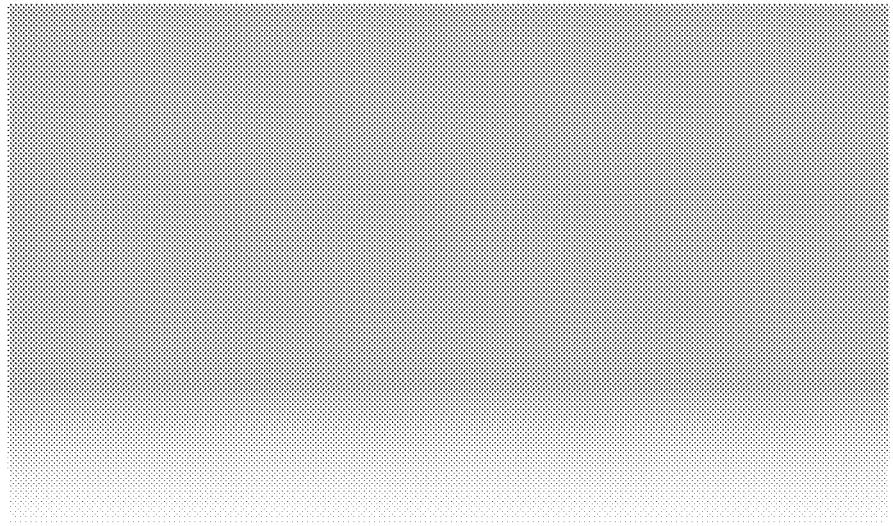
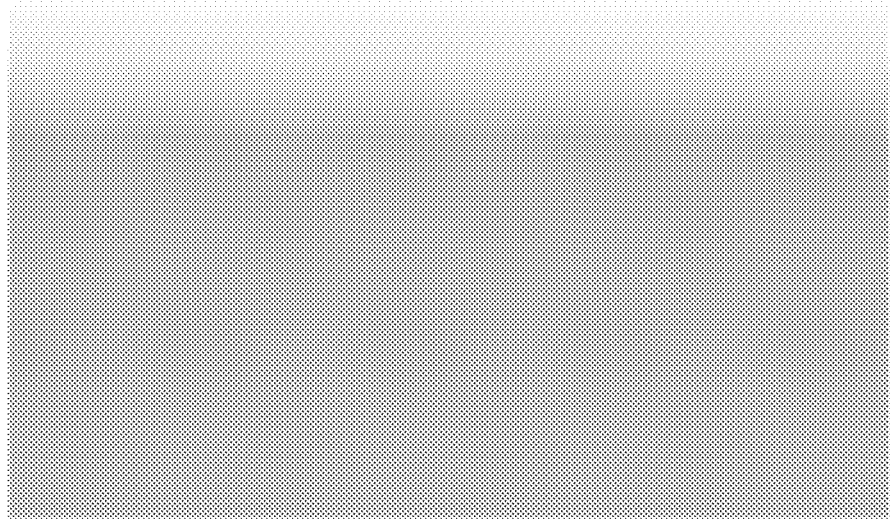
Figure 8D

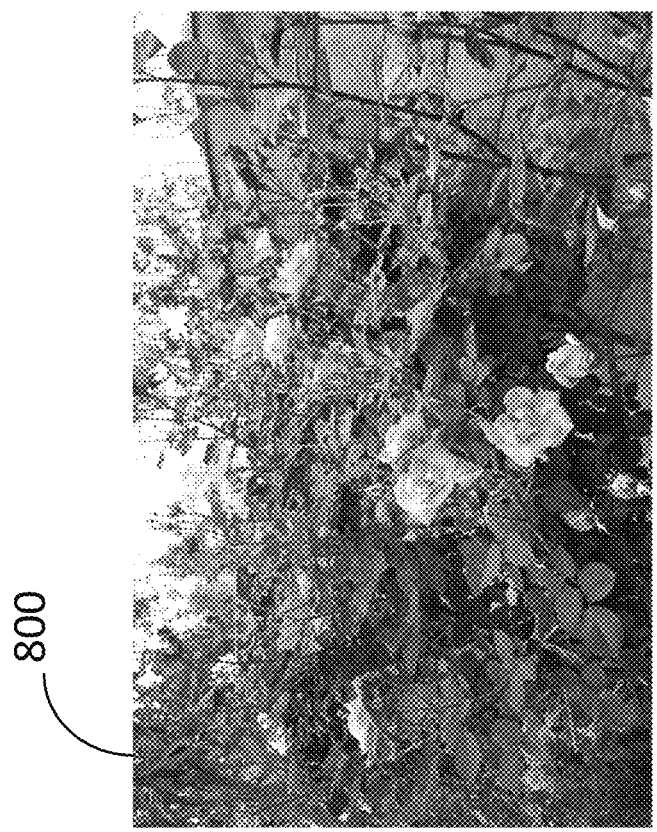
Figure 8E

1100 Arrange a plurality of light emitters, that corresponds to a first color space, in a first emission region of a display panel having a plurality of emission regions. Arrange a plurality of light emitters, that corresponds to a second color space, in one or more second emission regions of the display panel. The first emission region is distinct from and mutually exclusive to the one or more second emission regions, and the one or more second emission regions are disposed adjacent to the first emission region. The first color space is distinct from the second color space.

Figure 11

COLOR FOVEATED DISPLAY DEVICES AND METHODS OF MAKING THE SAME

RELATED APPLICATION

This application is a continuation application of U.S. patent application Ser. No. 16/171,135, filed Oct. 25, 2018, entitled "Color Foveated Display Devices And Methods Of Making The Same," which is incorporated by reference in its entirety.

TECHNICAL FIELD

This relates generally to head-mounted display devices, and more specifically to optical components used in head-mounted display devices.

BACKGROUND

Head-mounted display devices (also called herein head-mounted displays) are gaining popularity as means for providing visual information to users.

One or more display panels used in the head-mounted display devices have a plurality of light emitters configured to emit light. The head-mounted display devices consume a significant amount of power for driving a plurality of light emitters arranged in the one or more display panels that provide high-color fidelity images in the entire display panels. However, human eyes have a non-uniform color vision across a field of view because color sensing cones are concentrated in a foveal region of the eyes.

SUMMARY

Accordingly, there is a need for the head-mounted display devices that provide high-color fidelity images only for a foveal region of the eyes thereby reducing the power consumption of the display devices.

The above deficiencies and other problems are reduced or eliminated by the disclosed devices, systems, and methods.

In accordance with some embodiments, a display device includes a display panel configured to project light, the display panel having a plurality of emission regions that includes a first emission region and one or more second emission regions. The first emission region is distinct from and mutually exclusive to the one or more second emission regions and the one or more second emission regions are disposed adjacent to the first emission region. The display device includes a plurality of light emitters, arranged in the first emission region, corresponding to a first color gamut and a plurality of light emitters, arranged in the one or more second emission regions, corresponding to a second color gamut. The second color gamut is distinct from the first color gamut.

In accordance with some embodiments, a method of making a display device includes arranging a plurality of light emitters, that corresponds to a first color gamut, in a first emission region of a display panel having a plurality of emission regions and arranging a plurality of light emitters, that corresponds to a second color gamut, in one or more second emission regions of the display panel. The first emission region is distinct from and mutually exclusive to the one or more second emission regions and the one or more second emission regions are disposed adjacent to the first emission region. The first color gamut is distinct from the second color gamut.

Thus, the disclosed embodiments provide devices and methods that reduce power consumption.

BRIEF DESCRIPTION OF THE DRAWINGS

For a better understanding of the various described embodiments, reference should be made to the Description of Embodiments below, in conjunction with the following drawings in which like reference numerals refer to corresponding parts throughout the figures.

FIG. 8D represents a color gamut of light emitted from a display panel that is horizontally reduced in accordance with some embodiments.

FIG. 8E illustrates images that are displayed on a display panel in accordance with some embodiments.

FIG. 11 is a flow diagram illustrating a method of making a display device in accordance with some embodiments.

Figure 1:
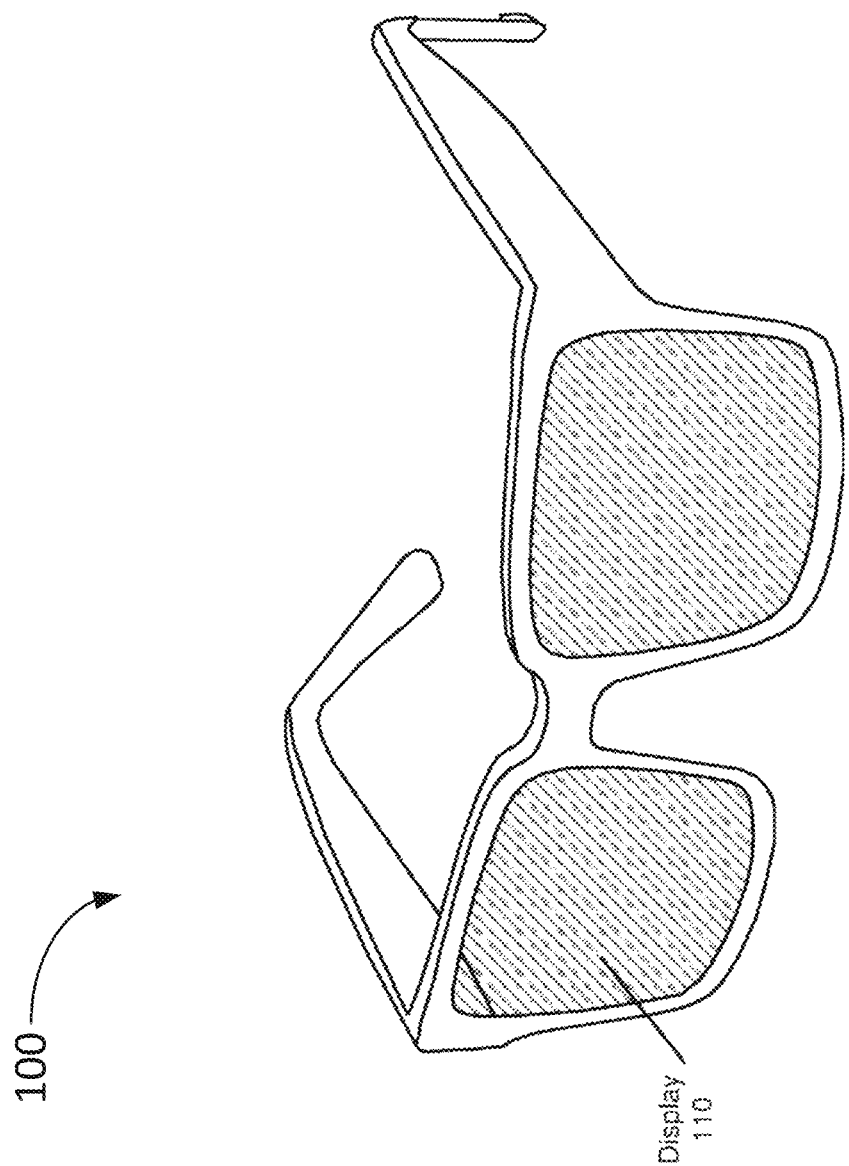
FIG. 1 is a perspective view of a display device in accordance with some embodiments.

These figures are not drawn to scale unless indicated otherwise.

DETAILED DESCRIPTION

Human eyes have a non-uniform color vision across a field of vision. For example, color sensing cones, which allow the perception of colors are concentrated around the fovea of the eye. To reduce the power consumption of head-mounted display devices, a color foveated display having multiple emission regions for providing images in different color gamuts is used.

In the color foveated display, a plurality of light emitters arranged in different emission regions corresponds to respective color gamuts. Such display is configured by arranging light emitters having different properties (e.g., a light emitter type, luminous efficacy, brightness, material, etc.) into different emission regions, adjusting the spacing between light emitters for different emission regions, and/or adjusting the current density for light emitters in different emission regions. Thus, the display reduces power consumption for computing, image processing and displaying while increasing luminous efficiency of the display and reducing cost to fabricate the display.

Reference will now be made to embodiments, examples of which are illustrated in the accompanying drawings. In the following description, numerous specific details are set forth in order to provide an understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

It will also be understood that, although the terms first, second, etc. are, in some instances, used herein to describe various elements, these elements should not be limited by these terms. These terms are used only to distinguish one element from another. For example, a first region could be termed a second region, and, similarly, a second region could be termed a first region, without departing from the scope of the various described embodiments. The first region and the second region are both regions, but they are not the same region.

The terminology used in the description of the various described embodiments herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "exemplary" is used herein in the sense of "serving as an example, instance, or illustration" and not in the sense of "representing the best of its kind."

As used herein, that a light emitter, a pixel, or a subpixel "has a particular color" means that the light emitter, the pixel, or the subpixel "is configured to provide light having the particular color." Typically, a color of light emitted by a light emitter, a pixel, or a subpixel depends on one or more materials included in the light emitter, the pixel, or the subpixel (e.g., an organic material or an inorganic material, such as a fluorescent material or an inorganic quantum well or dot, or a semiconductor material). For example, a light emitter, a pixel, or a subpixel configured to provide a red color includes aluminum gallium arsenide, gallium arsenide phosphide, aluminum gallium indium phosphide, and/or gallium phosphide; a light emitter, a pixel, or a subpixel configured to provide a green color includes aluminum gallium phosphide, aluminum gallium indium phosphide, and/or gallium phosphide; and a light emitter, a pixel, or a subpixel configured to provide a blue color includes zinc selenide, indium gallium nitride, and/silicon carbide.

Embodiments described herein may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

FIG. 1 illustrates display device 100 in accordance with some embodiments. In some embodiments, display device 100 is configured to be worn on a head of a user (e.g., by having the form of spectacles or eyeglasses, as shown in FIG. 1) or to be included as part of a helmet that is to be worn by the user. When display device 100 is configured to be worn on a head of a user or to be included as part of a helmet, display device 100 is called a head-mounted display. Alternatively, display device 100 is configured for placement in proximity of an eye or eyes of the user at a fixed location, without being head-mounted (e.g., display device 100 is mounted in a vehicle, such as a car or an airplane, for placement in front of an eye or eyes of the user). As shown in FIG. 1, display device 100 includes display 110. Display 110 is configured for presenting visual contents (e.g., augmented reality contents, virtual reality contents, mixed reality contents, or any combination thereof) to a user.

In some embodiments, display device 100 includes one or more components described below with respect to FIG. 2. In some embodiments, display device 100 includes additional components not shown in FIG. 2.

Figure 2:
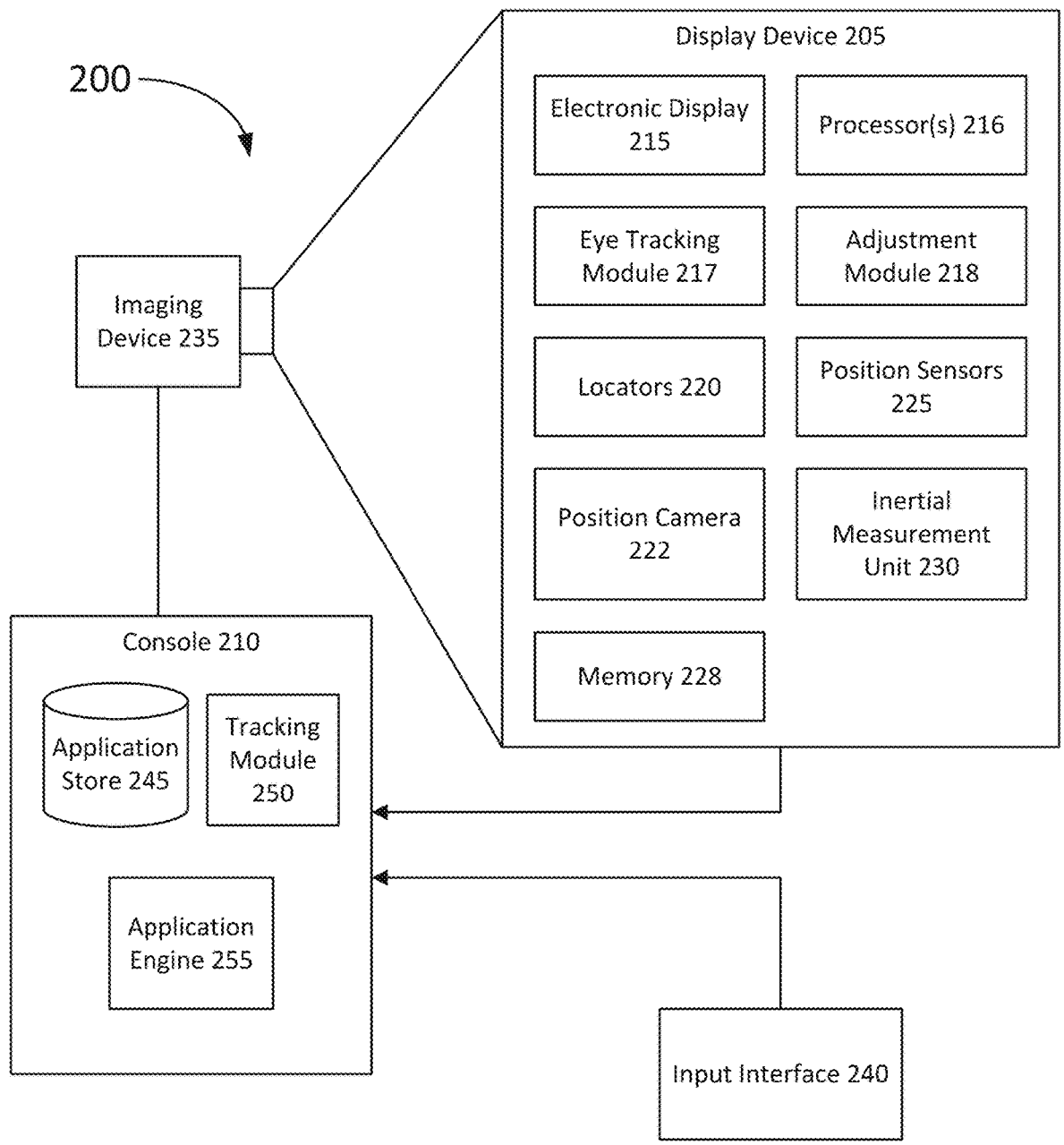
FIG. 2 is a block diagram of a system including a display device in accordance with some embodiments.

FIG. 2 is a block diagram of system 200 in accordance with some embodiments. The system 200 shown in FIG. 2 includes display device 205 (which corresponds to display device 100 shown in FIG. 1), imaging device 235, and input interface 240 that are each coupled to console 210. While FIG. 2 shows an example of system 200 including one display device 205, imaging device 235, and input interface 240, in other embodiments, any number of these components may be included in system 200. For example, there may be multiple display devices 205 each having associated input interface 240 and being monitored by one or more imaging devices 235, with each display device 205, input interface 240, and imaging devices 235 communicating with console 210. In alternative configurations, different and/or additional components may be included in system 200. For example, in some embodiments, console 210 is connected via a network (e.g., the Internet) to system 200 or is self-contained as part of display device 205 (e.g., physically located inside display device 205). In some embodiments, display device 205 is used to create mixed reality by adding in a view of the real surroundings. Thus, display device 205 and system 200 described here can deliver virtual reality, mixed reality, and augmented reality.

In some embodiments, as shown in FIG. 1, display device 205 is a head-mounted display that presents media to a user. Examples of media presented by display device 205 include one or more images, video, audio, or some combination thereof. In some embodiments, audio is presented via an external device (e.g., speakers and/or headphones) that receives audio information from display device 205, console 210, or both, and presents audio data based on the audio information. In some embodiments, display device 205 immerses a user in a virtual environment.

In some embodiments, display device 205 also acts as an augmented reality (AR) headset. In these embodiments, display device 205 augments views of a physical, real-world environment with computer-generated elements (e.g., images, video, sound, etc.). Moreover, in some embodiments, display device 205 is able to cycle between different types of operation. Thus, display device 205 operate as a virtual reality (VR) device, an AR device, as glasses or some combination thereof (e.g., glasses with no optical correction, glasses optically corrected for the user, sunglasses, or some combination thereof) based on instructions from application engine 255.

Display device 205 includes electronic display 215, one or more processors 216, eye tracking module 217, adjustment module 218, one or more locators 220, one or more position sensors 225, one or more position cameras 222, memory 228, inertial measurement unit (IMU) 230, or a subset or superset thereof (e.g., display device 205 with electronic display 215, one or more processors 216, and memory 228, without any other listed components). Some embodiments of display device 205 have different modules than those described here. Similarly, the functions can be distributed among the modules in a different manner than is described here.

One or more processors 216 (e.g., processing units or cores) execute instructions stored in memory 228. Memory 228 includes high-speed random access memory, such as DRAM, SRAM, DDR RAM or other random access solid state memory devices; and may include non-volatile memory, such as one or more magnetic disk storage devices, optical disk storage devices, flash memory devices, or other non-volatile solid state storage devices. Memory 228, or alternately the non-volatile memory device(s) within memory 228, includes a non-transitory computer readable storage medium. In some embodiments, memory 228 or the computer readable storage medium of memory 228 stores programs, modules and data structures, and/or instructions for displaying one or more images on electronic display 215.

Electronic display 215 displays images to the user in accordance with data received from console 210 and/or processor(s) 216. In various embodiments, electronic display 215 may comprise a single adjustable electronic display element or multiple adjustable electronic displays elements (e.g., a display for each eye of a user).

In some embodiments, the display element includes one or more light emission devices and a corresponding array of emission intensity array. An emission intensity array is an array of electro-optic pixels, opto-electronic pixels, some other array of devices that dynamically adjust the amount of light transmitted by each device, or some combination thereof. These pixels are placed behind one or more lenses. In some embodiments, the emission intensity array is an array of liquid crystal based pixels in an LCD (a Liquid Crystal Display). Examples of the light emission devices include: an organic light emitting diode, an active-matrix organic light-emitting diode, a light emitting diode, some type of device capable of being placed in a flexible display, or some combination thereof. The light emission devices include devices that are capable of generating visible light (e.g., red, green, blue, etc.) used for image generation. The emission intensity array is configured to selectively attenuate individual light emission devices, groups of light emission devices, or some combination thereof. Alternatively, when the light emission devices are configured to selectively attenuate individual emission devices and/or groups of light emission devices, the display element includes an array of such light emission devices without a separate emission intensity array.

One or more lenses direct light from the arrays of light emission devices (optionally through the emission intensity arrays) to locations within each eyebox and ultimately to the back of the user's retina(s). An eyebox is a region that is occupied by an eye of a user located proximity to display device 205 (e.g., a user wearing display device 205) for viewing images from display device 205. In some cases, the eyebox is represented as a 10 mm×10 mm square. In some embodiments, the one or more lenses include one or more coatings, such as anti-reflective coatings.

In some embodiments, the display element includes an infrared (IR) detector array that detects IR light that is retro-reflected from the retinas of a viewing user, from the surface of the corneas, lenses of the eyes, or some combination thereof. The IR detector array includes an IR sensor or a plurality of IR sensors that each correspond to a different position of a pupil of the viewing user's eye. In alternate embodiments, other eye tracking systems may also be employed.

Eye tracking module 217 determines locations of each pupil of a user's eyes. In some embodiments, eye tracking module 217 instructs electronic display 215 to illuminate the eyebox with IR light (e.g., via IR emission devices in the display element).

A portion of the emitted IR light will pass through the viewing user's pupil and be retro-reflected from the retina toward the IR detector array, which is used for determining the location of the pupil. Alternatively, the reflection off of the surfaces of the eye is used to also determine location of the pupil. The IR detector array scans for retro-reflection and identifies which IR emission devices are active when retro-reflection is detected. Eye tracking module 217 may use a tracking lookup table and the identified IR emission devices to determine the pupil locations for each eye. The tracking lookup table maps received signals on the IR detector array to locations (corresponding to pupil locations) in each eyebox. In some embodiments, the tracking lookup table is generated via a calibration procedure (e.g., user looks at various known reference points in an image and eye tracking module 217 maps the locations of the user's pupil while looking at the reference points to corresponding signals received on the IR tracking array). As mentioned above, in some embodiments, system 200 may use other eye tracking systems than the embedded IR one described above.

Adjustment module 218 generates an image frame based on the determined locations of the pupils. In some embodiments, this sends a discrete image to the display that will tile subimages together thus a coherent stitched image will appear on the back of the retina. Adjustment module 218 adjusts an output (i.e. the generated image frame) of electronic display 215 based on the detected locations of the pupils. Adjustment module 218 instructs portions of electronic display 215 to pass image light to the determined locations of the pupils. In some embodiments, adjustment module 218 also instructs the electronic display to not pass image light to positions other than the determined locations of the pupils. Adjustment module 218 may, for example, block and/or stop light emission devices whose image light falls outside of the determined pupil locations, allow other light emission devices to emit image light that falls within the determined pupil locations, translate and/or rotate one or more display elements, dynamically adjust curvature and/or refractive power of one or more active lenses in the lens (e.g., microlens) arrays, or some combination thereof.

Optional locators 220 are objects located in specific positions on display device 205 relative to one another and relative to a specific reference point on display device 205. A locator 220 may be a light emitting diode (LED), a corner cube reflector, a reflective marker, a type of light source that contrasts with an environment in which display device 205 operates, or some combination thereof. In embodiments where locators 220 are active (i.e., an LED or other type of light emitting device), locators 220 may emit light in the visible band (e.g., about 400 nm to 750 nm), in the infrared band (e.g., about 750 nm to 1 mm), in the ultraviolet band (about 100 nm to 400 nm), some other portion of the electromagnetic spectrum, or some combination thereof.

In some embodiments, locators 220 are located beneath an outer surface of display device 205, which is transparent to the wavelengths of light emitted or reflected by locators 220 or is thin enough to not substantially attenuate the wavelengths of light emitted or reflected by locators 220. Additionally, in some embodiments, the outer surface or other portions of display device 205 are opaque in the visible band of wavelengths of light. Thus, locators 220 may emit light in the IR band under an outer surface that is transparent in the IR band but opaque in the visible band.

IMU 230 is an electronic device that generates calibration data based on measurement signals received from one or more position sensors 225. Position sensor 225 generates one or more measurement signals in response to motion of display device 205. Examples of position sensors 225 include: one or more accelerometers, one or more gyroscopes, one or more magnetometers, another suitable type of sensor that detects motion, a type of sensor used for error correction of IMU 230, or some combination thereof. Position sensors 225 may be located external to IMU 230, internal to IMU 230, or some combination thereof.

Based on the one or more measurement signals from one or more position sensors 225, IMU 230 generates first calibration data indicating an estimated position of display device 205 relative to an initial position of display device 205. For example, position sensors 225 include multiple accelerometers to measure translational motion (forward/back, up/down, left/right) and multiple gyroscopes to measure rotational motion (e.g., pitch, yaw, roll). In some embodiments, IMU 230 rapidly samples the measurement signals and calculates the estimated position of display device 205 from the sampled data. For example, IMU 230 integrates the measurement signals received from the accelerometers over time to estimate a velocity vector and integrates the velocity vector over time to determine an estimated position of a reference point on display device 205. Alternatively, IMU 230 provides the sampled measurement signals to console 210, which determines the first calibration data. The reference point is a point that may be used to describe the position of display device 205. While the reference point may generally be defined as a point in space; however, in practice the reference point is defined as a point within display device 205 (e.g., a center of IMU 230).

In some embodiments, IMU 230 receives one or more calibration parameters from console 210. As further discussed below, the one or more calibration parameters are used to maintain tracking of display device 205. Based on a received calibration parameter, IMU 230 may adjust one or more IMU parameters (e.g., sample rate). In some embodiments, certain calibration parameters cause IMU 230 to update an initial position of the reference point so it corresponds to a next calibrated position of the reference point. Updating the initial position of the reference point as the next calibrated position of the reference point helps reduce accumulated error associated with the determined estimated position. The accumulated error, also referred to as drift error, causes the estimated position of the reference point to "drift" away from the actual position of the reference point over time.

Imaging device 235 generates calibration data in accordance with calibration parameters received from console 210. Calibration data includes one or more images showing observed positions of locators 220 that are detectable by imaging device 235. In some embodiments, imaging device 235 includes one or more still cameras, one or more video cameras, any other device capable of capturing images including one or more locators 220, or some combination thereof. Additionally, imaging device 235 may include one or more filters (e.g., used to increase signal to noise ratio). Imaging device 235 is configured to optionally detect light emitted or reflected from locators 220 in a field of view of imaging device 235. In embodiments where locators 220 include passive elements (e.g., a retroreflector), imaging device 235 may include a light source that illuminates some or all of locators 220, which retro-reflect the light towards the light source in imaging device 235. Second calibration data is communicated from imaging device 235 to console 210, and imaging device 235 receives one or more calibration parameters from console 210 to adjust one or more imaging parameters (e.g., focal length, focus, frame rate, ISO, sensor temperature, shutter speed, aperture, etc.).

Input interface 240 is a device that allows a user to send action requests to console 210. An action request is a request to perform a particular action. For example, an action request may be to start or end an application or to perform a particular action within the application. Input interface 240 may include one or more input devices. Example input devices include: a keyboard, a mouse, a game controller, data from brain signals, data from other parts of the human body, or any other suitable device for receiving action requests and communicating the received action requests to console 210. An action request received by input interface 240 is communicated to console 210, which performs an action corresponding to the action request. In some embodiments, input interface 240 may provide haptic feedback to the user in accordance with instructions received from console 210. For example, haptic feedback is provided when an action request is received, or console 210 communicates instructions to input interface 240 causing input interface 240 to generate haptic feedback when console 210 performs an action.

Console 210 provides media to display device 205 for presentation to the user in accordance with information received from one or more of: imaging device 235, display device 205, and input interface 240. In the example shown in FIG. 2, console 210 includes application store 245, tracking module 250, and application engine 255. Some embodiments of console 210 have different modules than those described in conjunction with FIG. 2. Similarly, the functions further described below may be distributed among components of console 210 in a different manner than is described here.

When application store 245 is included in console 210, application store 245 stores one or more applications for execution by console 210. An application is a group of instructions, that when executed by a processor, is used for generating content for presentation to the user. Content generated by the processor based on an application may be in response to inputs received from the user via movement of display device 205 or input interface 240. Examples of applications include: gaming applications, conferencing applications, video playback application, or other suitable applications.

When tracking module 250 is included in console 210, tracking module 250 calibrates system 200 using one or more calibration parameters and may adjust one or more calibration parameters to reduce error in determination of the position of display device 205. For example, tracking module 250 adjusts the focus of imaging device 235 to obtain a more accurate position for observed locators on display device 205. Moreover, calibration performed by tracking module 250 also accounts for information received from IMU 230. Additionally, if tracking of display device 205 is lost (e.g., imaging device 235 loses line of sight of at least a threshold number of locators 220), tracking module 250 re-calibrates some or all of system 200.

In some embodiments, tracking module 250 tracks movements of display device 205 using second calibration data from imaging device 235. For example, tracking module 250 determines positions of a reference point of display device 205 using observed locators from the second calibration data and a model of display device 205. In some embodiments, tracking module 250 also determines positions of a reference point of display device 205 using position information from the first calibration data. Additionally, in some embodiments, tracking module 250 may use portions of the first calibration data, the second calibration data, or some combination thereof, to predict a future location of display device 205. Tracking module 250 provides the estimated or predicted future position of display device 205 to application engine 255.

Application engine 255 executes applications within system 200 and receives position information, acceleration information, velocity information, predicted future positions, or some combination thereof of display device 205 from tracking module 250. Based on the received information, application engine 255 determines content to provide to display device 205 for presentation to the user. For example, if the received information indicates that the user has looked to the left, application engine 255 generates content for display device 205 that mirrors the user's movement in a virtual environment. Additionally, application engine 255 performs an action within an application executing on console 210 in response to an action request received from input interface 240 and provides feedback to the user that the action was performed. The provided feedback may be visual or audible feedback via display device 205 or haptic feedback via input interface 240.

Figure 3:
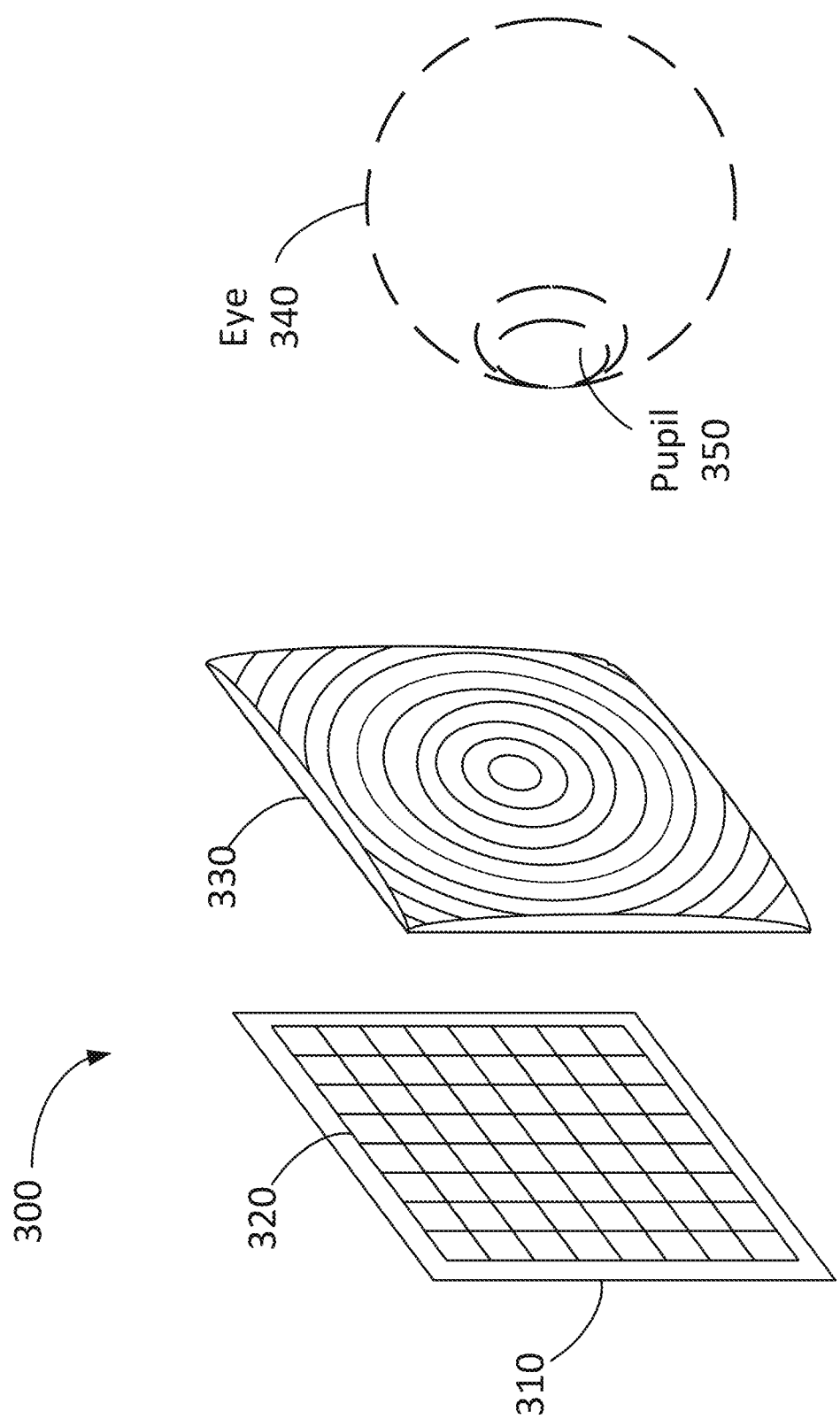
FIG. 3 is an isometric view of a display device in accordance with some embodiments.

FIG. 3 is an isometric view of display device 300 in accordance with some embodiments. In some other embodiments, display device 300 is part of some other electronic display (e.g., digital microscope, etc.). In some embodiments, display device 300 includes light emission device array 310 and one or more lenses 330. In some embodiments, display device 300 also includes an emission intensity array and an IR detector array.

Light emission device array 310 emits image light and optional IR light toward the viewing user. Light emission device array 310 may be, e.g., an array of LEDs, an array of microLEDs, an array of OLEDs, or some combination thereof. Light emission device array 310 includes light emission devices 320 that emit light in the visible light (and optionally includes devices that emit light in the IR). In some embodiments, a microLED includes an LED with an emission area characterized by a representative dimension (e.g., a diameter, a width, a height, etc.) of 100 µm or less (e.g., 50 µm, 20 µm, etc.). In some embodiments, a microLED has an emission area having a shape of a circle or a rectangle.

The emission intensity array is configured to selectively attenuate light emitted from light emission array 310. In some embodiments, the emission intensity array is composed of a plurality of liquid crystal cells or pixels, groups of light emission devices, or some combination thereof. Each of the liquid crystal cells is, or in some embodiments, groups of liquid crystal cells are, addressable to have specific levels of attenuation. For example, at a given time, some of the liquid crystal cells may be set to no attenuation, while other liquid crystal cells may be set to maximum attenuation. In this manner the emission intensity array is able to control what portion of the image light emitted from light emission device array 310 is passed to the one or more lenses 330. In some embodiments, display device 300 uses the emission intensity array to facilitate providing image light to a location of pupil 350 of eye 340 of a user, and minimize the amount of image light provided to other areas in the eyebox.

One or more lenses 330 receive the modified image light (e.g., attenuated light) from the emission intensity array (or directly from emission device array 310), and shifted by one or more beam shifters 360, and direct the shifted image light to a location of pupil 350.

An optional IR detector array detects IR light that has been retro-reflected from the retina of eye 340, a cornea of eye 340, a crystalline lens of eye 340, or some combination thereof. The IR detector array includes either a single IR sensor or a plurality of IR sensitive detectors (e.g., photodiodes). In some embodiments, the IR detector array is separate from light emission device array 310. In some embodiments, the IR detector array is integrated into light emission device array 310.

In some embodiments, light emission device array 310 and the emission intensity array make up a display element. Alternatively, the display element includes light emission device array 310 (e.g., when light emission device array 310 includes individually adjustable pixels) without the emission intensity array. In some embodiments, the display element additionally includes the IR array. In some embodiments, in response to a determined location of pupil 350, the display element adjusts the emitted image light such that the light output by the display element is refracted by one or more lenses 330 toward the determined location of pupil 350, and not toward other locations in the eyebox.

A significant portion of power used for operating a head-mounted display device is used for (i) computation needed to render high-color fidelity images, (ii) data transmission for displaying images and (iii) conversion of electrical energy to light for displaying the rendered images. Human eyes have a non-uniform color vision across a field of view. For example, color sensing cones are densely packed in the fovea centralis that is responsible for a foveal vision, and the number of the color sensing cells rapidly decreases toward a peripheral area of a retina of the eyes. To reduce the power consumption of head-mounted display devices, a color foveated display having multiple emission regions to provide images in multiple color gamuts are used. For example, a central emission region corresponding to the fovea of the eye is configured to provide high color fidelity while a peripheral emission region corresponding to the peripheral area of the retina of the eye is configured to increase luminous efficiency and minimize power consumption (even at the expense of reducing the color fidelity).

Figure 4:
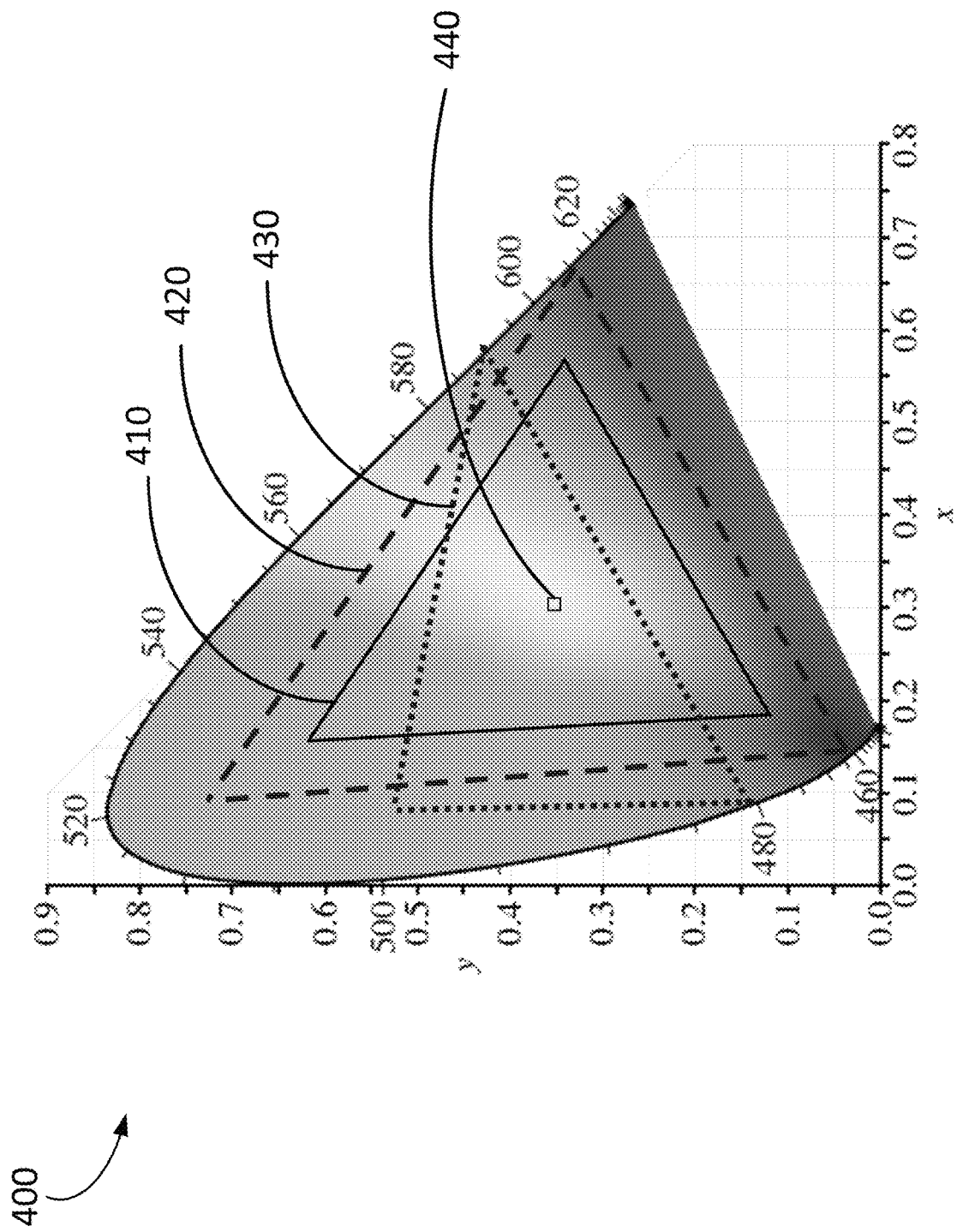
FIG. 4 illustrates a chromaticity diagram in accordance with some embodiments.

FIG. 4 illustrates a chromaticity diagram 400 in accordance with some embodiments.

The chromaticity diagram 400 represents human color perception in a two-dimensional chart (e.g., CIE 1931 xy chromaticity diagram). In FIG. 4, the chromaticity diagram 400 has an outer curved boundary that corresponds to spectral loci corresponding to various colors, with wavelengths listed in nanometers.

In some embodiments, a color gamut is defined as a specific organization of colors (e.g., sRGB color gamut, Adobe RGB color gamut, CIELUV color gamut, etc.). In some embodiments, the color gamut is represented by a line or shape formed by connecting at least two colors (e.g., red and blue, green and blue, red, green, and blue, etc.) on the chromaticity diagram 400. In some embodiments, the color gamut has a triangle shape (e.g., an equilateral triangle, isosceles triangle, scalene triangle, etc.) formed by connecting three points of colors (e.g., red, green, and blue) on the chromaticity diagram 400. In some embodiments, the color gamut has any other shapes (e.g., a square, rectangle, etc.). In some embodiments, different color gamuts have a same shape of different sizes or different shapes of same or different sizes (e.g., same or different areas). In some embodiments, at least two color gamuts represented in a same chromaticity diagram (e.g., the chromaticity diagram 400) partially overlap each other in the chromaticity diagram 400.

In FIG. 4, the chromaticity diagram 400 includes a first color gamut 410, a second color gamut 420, and a third color gamut 430 that are distinct from one another. A dot 440 represents a center of the chromaticity diagram 400 that corresponds to a white color. In FIG. 4, a first color gamut 410 has a same triangle shape as a second color gamut 420 that is larger than the first color gamut 410, and the first color gamut 410 is included in (or encompassed by) the second color gamut 420. In FIG. 4, the first color gamut 410 and the third color gamut 430 have different triangle shapes and the first color gamut 410 and the third color gamut 430 partially overlap each other (e.g., a portion of the first color gamut 410 is not included in the third color gamut 430 and a portion of the third color gamut 430 is not included in the first color gamut 410). As shown in FIG. 4, the second color gamut 420 and the third color gamut 430 have different triangle shapes, and the second color gamut 420 and the third color gamut 430 partially overlap each other (e.g., a portion of the second color gamut 420 is not included in the third color gamut 430 and a portion of the third color gamut 430 is not included in the second color gamut 420).

In some embodiments, a respective color gamut includes a plurality of colors formed by mixing the at least two colors (e.g., reference colors) of the color gamut. A color gamut includes a plurality of colors located inside the shape or on the line, formed by the reference colors, in the chromaticity diagram 400. For example, in FIG. 4, the second color gamut 420, that is larger than the first color gamut 410, encompasses more colors than the first color gamut 410.

Colors outside the first color gamut 410 are not displayable in an emission region configured to provide colors within the first color gamut 410 only (e.g., an emission region with three types of LEDs, each type configured to provide a respective color that corresponds to a respective corner of the first color gamut 410 cannot provide a color outside the first color gamut 410), colors outside the second color gamut 420 are not displayable in an emission region configured to provide colors within the second color gamut 420 only (e.g., an emission region with three types of LEDs, each type configured to provide a respective color that corresponds to a respective corner of the second color gamut 420 cannot provide a color outside the second color gamut 420), and color outside the third color gamut 430 are not displayable in an emission region configured to provide colors within the third color gamut 430 only (e.g., an emission region with three types of LEDs, each type configured to provide a respective color that corresponds to a respective corner of the third color gamut 430 cannot provide a color outside the third color gamut 430). Thus, a portion of the second color gamut 420 that does not overlap with the first color gamut 410 indicates colors that are not displayable in an emission region configured to provide colors within the first color gamut 410 only. A portion of the first color gamut 410 that does not overlap with the second color gamut 420 indicates colors that are not displayable in an emission region configured to provide colors within the second color gamut 420 only. Colors outside the third color gamut 430 are not displayable in an emission region configured to provide colors within the third color gamut 430 only.

Figure 5:
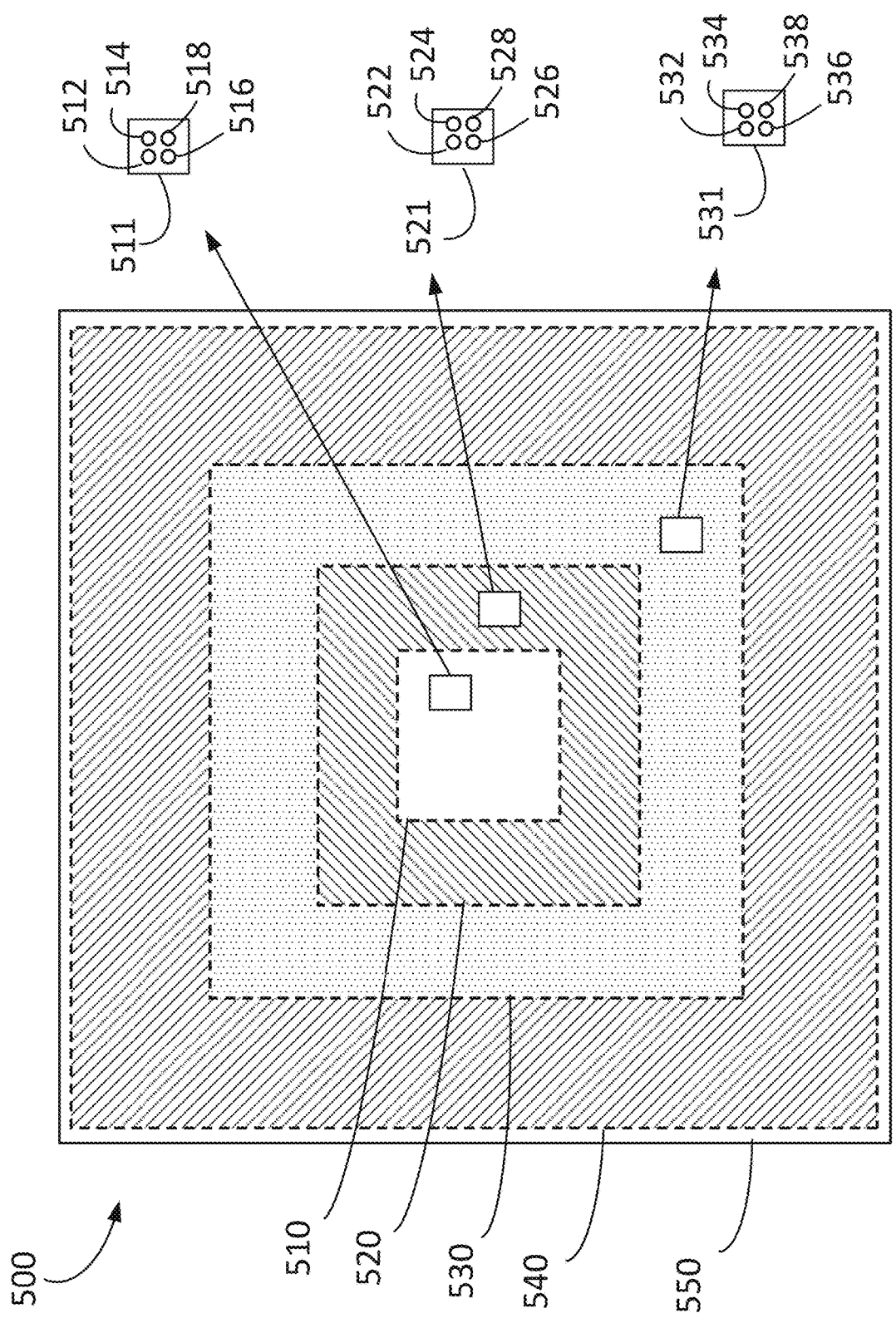
FIG. 5 illustrates a display panel in accordance with some embodiments.

FIG. 5 illustrates a display panel 500 in accordance with some embodiments.

In some embodiments, the display panel 500 corresponds to the light emission device array 310 shown in FIG. 3. In some embodiments, the display panel 500 is coupled with a circuit board 550. The display panel 500 includes a first emission region 510, a second emission region 520, a third emission region 530, and a fourth emission region 540. Although FIG. 5 illustrates the display panel 500 with four emission regions, the display panel 500 is not limited to having four emission regions, and may have fewer or more emission regions (e.g., at least 2, 3, 5, 6, or 7 regions, etc.).

In some embodiments, the first emission region 510 is configured to provide images having colors in a first color gamut (e.g., the first color gamut 410) (e.g., for providing images having colors in the first color gamut to a fovea of a user's eyes) and the other emission regions (e.g., the second emission region 520, the third emission region 530, and the fourth emission region 540) are configured to provide images having colors in a color gamut that is distinct from the first color gamut of the first emission region 510 (e.g., for providing images having colors in a color gamut that is distinct from the first color gamut to a peripheral vision area of the user's eyes). The second emission region 520 is distinct from and mutually exclusive to the first emission region 510. Although FIG. 5 illustrates the second emission region 520 as a single contiguous region, in some embodiments, the second emission region 520 includes two or more separate second emission regions that are disposed adjacent to the first emission region 510. For example, although FIG. 5 illustrates the second emission region 520 surrounding the first emission region 510, in some embodiments, two separate second emission regions (each having a linear shape for example) are located on opposite sides of the first emission region 510. The third emission region 530 is distinct from and mutually exclusive to the second emission region 520. Although FIG. 5 illustrates the third emission region 530 as a single contiguous region, in some embodiments, the third emission region 530 includes two or more separate third emission regions that are disposed adjacent to the second emission region 520. For example, although FIG. 5 illustrates the third emission region 530 surrounding the second emission region 520, in some embodiments, two separate third emission regions (each having a linear shape for example) are located on opposite sides of the second emission region 520. The fourth emission region 540 is distinct from and mutually exclusive to the third emission region 530. Although FIG. 5 illustrates the fourth emission region 540 as a single contiguous region, in some embodiments, the fourth emission region 540 includes two or more separate fourth emission regions that are disposed adjacent to the third emission region 530. For example, although FIG. 5 illustrates the fourth emission region 540 surrounding the third emission region 530, in some embodiments, two separate fourth emission regions (each having a linear shape for example) are located on opposite sides of the third emission region 530.

In some embodiments, as shown in FIG. 5, the first emission region 510 is surrounded by the second emission region 520, the second emission region 520 is surrounded by the third emission region 530 and the third emission region 530 is surrounded by the fourth emission region 540.

In some embodiments, the first emission region 510 occupies no more than 50% of the display area of the display panel 500. In some embodiments, the first emission region 510 occupies less than 20%, less than 10%, or less than 5% of the display area of the display panel 500.

In some embodiments, the second emission region 520 is in contact with the first emission region 510. In some embodiments, the third emission region 530 is in contact with the second emission region 520. In some embodiments, the fourth emission region 540 is in contact with the third emission region 530.

In some embodiments, the second emission region 520 is distinct and separate from the first emission region 510. In some embodiments, the third emission region 530 is distinct and separate from the first emission region 510 and the second emission region 520. In some embodiments, the fourth emission region 540 is distinct and separate from the first emission region 510, the second emission region 520, and the third emission region 530.

In some embodiments, the display panel 500 includes a plurality of light emitters, that corresponds to a first color gamut, arranged in the first emission region 510, and a plurality of light emitters, that corresponds to a second color gamut, arranged in the second emission region 520. In some embodiments, the display panel 500 includes a plurality of light emitters, that corresponds to a third color gamut, in the third emission region 530, and a plurality of light emitters, that corresponds to a fourth color gamut, in the fourth emission region 540. As described above, the first color gamut, the second color gamut, the third color gamut, and the fourth color gamut are distinct from each other (e.g., the first color gamut and the second color gamut have a same shape of different sizes in the chromaticity diagram 400, or the first color gamut and the second color gamut have different shapes in the chromaticity diagram 400).

A plurality of light emitters in a respective emission region (e.g., the first emission region 510, the second emission region 520, the third emission region 530, the fourth emission region 540, etc.) is configured to emit light of representative colors within a respective color gamut (e.g., each type of a light emitter in the respective emission region is configured to provide light of a respective representative color that corresponds to a corner of the respective color gamut). For example, one or more light emitters in the first emission region 510 are configured to emit light having a first color (e.g., red) within the first color gamut, one or more light emitters in the first emission region 510 are configured to emit light having a second color (e.g., green), distinct from the first color, within the first color gamut, and one or more light emitters in the first emission region 510 are configured to emit light having a third color (e.g., blue), distinct from the first color and the second color, within the first color gamut.

In some embodiments, the plurality of light emitters in the first emission region 510 is configured to emit light having colors of the first color gamut while the plurality of light emitters in the second emission region 520 is configured to emit light having colors of the second color gamut. In some embodiments, a plurality of light emitters in a same emission region (e.g., the plurality of light emitters in the first emission region 510 or the plurality of light emitters in the second emission region 520, etc.) provide light of at least two different colors, that are distinct from each other, within the respective color gamut. For example, a plurality of light emitters in the first emission region 510 includes a first group of two or more light emitters having a first representative color (e.g., providing light having the first representative color, such as a red light) and a second group of two or more light emitters having a second representative color (e.g., providing light having the second representative color, such as a blue light) that is distinct from the first representative color. In some embodiments, the first representative color and the second representative color are within the first color gamut. In some embodiments, the plurality of light emitters in the first emission region 510 includes two or more light emitters having a color that is distinct from the first representative color and the second representative color (e.g., providing light having a color that is distinct from the first representative color and the second representative color, such as providing a green light). In some embodiments, the plurality of light emitters in the second emission region 520 includes a third group of one or more light emitters having a third representative color (e.g., providing light having the third representative color, such as a yellow light) and a fourth group of one or more light emitters having a fourth representative color that is distinct from the third representative color (e.g., providing light having the fourth representative color, such as a cyan light). The number of groups of a plurality of light emitters in the respective emission region is not limited to two, can be more than two (e.g., three, four, five, etc.).

In some embodiments, at least one light emitter of the plurality of light emitters in the first emission region 510 is configured to emit light having a representative color that is distinct from a representative color of at least one light emitter of the plurality of light emitters in the second emission region 520. For example, the third representative color of the third group of one or more light emitters is distinct from the first representative color of the first group of two or more light emitters or the second representative color of the second group of two or more light emitters, while, in some embodiments, the fourth representative color of the fourth group of one or more light emitters is identical to the first representative color of the first group of two or more light emitters or the second representative color of the second group of two or more light emitters.

In some embodiments, even though the first color gamut is distinct from the second color gamut, the first color gamut partially overlaps with the second color gamut in a chromaticity diagram (e.g., the first color gamut 410 and the third color gamut 430 in the chromaticity diagram 400 as illustrated in FIG. 4), or the first color gamut is included in the second color gamut (e.g., the first color gamut 410 and the second color gamut 420 in the chromaticity diagram as illustrated in FIG. 4).

In some embodiments, at least one light emitter of the plurality of light emitters in the first emission region 510 is configured to emit light having a same hue as at least one light emitter of the plurality of light emitters in the second emission region 520. For example, a hue of the fourth representative color of the fourth group of one or more light emitters is the same as a hue of the second representative color of the second group of two or more light emitters.

In some embodiments, at least one light emitter of the plurality of light emitters in the first emission region 510 is configured to emit light having a same peak wavelength as at least one light emitter of the plurality of light emitters in the second emission region 520.

In some embodiments, a respective light emitter of a respective group (e.g., the first group of two or more light emitters, the second group of two or more light emitters, etc.) has an emission wavelength in a same wavelength range. In some embodiments, a wavelength range is defined as a range between a longest wavelength and a shortest wavelength of a respective light emitter of the two or more light emitters. In some embodiments, the two or more light emitters of the first group have emission wavelengths in a first wavelength range (e.g., 610-700 nm). For example, a light emitter of the two or more light emitters of the first group may be configured to emit light having a shortest wavelength (e.g., 610 nm) of the first wavelength range while another light emitter of the first group may be configured to emit light having a longest wavelength (e.g., 700 nm) of the first wavelength range.

In some embodiments, light emitters of at least two groups in the same emission region (e.g., the two or more light emitters of the first group and the two or more light emitters of the second group in the first emission region 510, or the one or more light emitters of the third group and the one or more light emitters of the fourth group in the second emission region 520) have wavelength ranges that are distinct from each other. In some embodiments, the two or more light emitters of the first group have emission wavelengths in the first wavelength range (e.g., 610-700 nm), and the two or more light emitters of the second group have emission wavelengths in a second wavelength range (e.g., 710-750 nm) that is distinct from the first wavelength range. In some embodiments, the second wavelength range is mutually exclusive to the first wavelength range. In some embodiments, the one or more light emitters of the third group have emission wavelengths in a third wavelength range (e.g., 500-560 nm), and the one or more light emitters of the fourth group have emission wavelengths in a fourth wavelength range (e.g., 430-490 nm) that is distinct from the third wavelength range. In some embodiments, the fourth wavelength range is mutually exclusive to the third wavelength range.

In some embodiments, light emitters of at least two groups in the same emission region have wavelength ranges that partially overlap one another. In some embodiments, the first wavelength range (e.g., 610-700 nm) is entirely included in the second wavelength range (e.g., 600-780 nm). Alternatively, the first wavelength range (e.g., 610-700 nm) partially overlaps with the second wavelength range (e.g., 640-750 nm). In this case, at least one light emitter of the first group may have a same wavelength (e.g., 650 nm) as at least one light emitter of the second group.

In some embodiments, light emitters of at least two groups in different emission regions (e.g., the two or more light emitters of the first group in the first emission region 510, and the one or more light emitters of the third group in the second emission region 520) have wavelength ranges that are distinct from each other. In some embodiments, the first wavelength range (e.g., 610-700 nm) is distinct from the third wavelength range (e.g., 500-560 nm) and the fourth wavelength range (e.g., 480-580 nm). In some embodiments, the second wavelength range (e.g., 640-750 nm) is distinct from the third wavelength range (e.g., 500-560 nm) and the fourth wavelength range (e.g., 480-580 nm).

In some embodiments, light emitters of at least two groups in different emission regions have wavelength ranges that entirely or partially overlap one another. In some embodiments, the third wavelength range (e.g., 580-620 nm) partially overlaps with the first wavelength range (e.g., 610-700 nm), and the fourth wavelength range (e.g., 600-640 nm) partially overlaps with the second wavelength range (e.g., 640-750 nm). In this case, at least one light emitter of the first group may have a same wavelength (e.g., 615 nm) as at least one light emitter of the third group.

The right-hand side of FIG. 5 illustrates an enlarged view of a respective pixel of a plurality of pixels in the first emission region 510, the second emission region 520, and the third emission region 530. In some embodiments, the respective pixel includes a subpixel combination to provide (light having) colors of the respective color gamut (e.g., the first color gamut, the second color gamut, or the third color gamut, etc.). In some embodiments, the subpixel combination includes two or more subpixels. For example, a single pixel includes two or more subpixels for providing two or more colors (e.g., a red color subpixel, a green color subpixel, and a blue color subpixel for an RGB pixel). In some embodiments, each subpixel includes a single light emitter, and two or more light emitters corresponding to the subpixel combination are arranged in the respective emission region. In some embodiments, the subpixel combination having two or more colors correspond to peak wavelengths of the two or more light emitters. In some embodiments, a subpixel layout for the subpixel combination is an m-by-m matrix arrangement (e.g., a 2-by-2 matrix, 3-by-3 matrix, etc.), an m-by-n matrix arrangement (e.g., a 3-by-2 matrix, 2-by-3 matrix, etc.) where m is different from n, a linear arrangement, a triangle arrangement, or any other arrangements corresponding to other shapes (e.g., a rectangular, hexagon, etc.).

In FIG. 5, the subpixel combination of the respective pixel includes four subpixels arranged in a 2-by-2 matrix arrangement. In some embodiments, a pixel 511 of the first emission region 510 includes a first subpixel combination of subpixels 512, 514, 516, 518. In some embodiments, a pixel 521 of the second emission region 520 includes a second subpixel combination of subpixels 522, 524, 526, 528, and a pixel 531 of the third emission region 530 includes a third subpixel combination of subpixels 532, 534, 536, 538. As describe above, the plurality of light emitters corresponding to different color gamuts are used in different emission regions, so that the pixel 511 has a color gamut that is distinct from those of the pixel 521 and the pixel 531 (e.g., the pixel 511 has a relatively high color gamut than the pixel 521 and the pixel 531). In some embodiments, the pixel 521 has a color gamut that is distinct from that of the pixel 531 (e.g., the pixel 521 has a relatively high color gamut than the pixel 531).

In some embodiments, each subpixel of the subpixel combination has a unique color (e.g., each subpixel of the subpixel combination has a different hue). For example, the subpixels 512, 514, 516, 518 of the first subpixel combination have four different hues (e.g., the subpixel 512 has a red color, the subpixel 514 has a yellow color, the subpixel 516 has a green color, and the subpixel 518 has a blue color). In some embodiments, at least two subpixels of the subpixel combination have a same color. For example, the subpixel 514 and the subpixel 516 may have the same color (e.g., green color, etc.) while the subpixel 512 and the subpixel 518 have different two colors (e.g., red and blue colors) that are distinct from the color of the subpixels 514 and 516.

In some embodiments, subpixel combinations in different emission regions are distinct from each other. In some embodiments, one or more subpixels of the first subpixel combination corresponds to hues different from those of one or more subpixels of the second subpixel combination. For example, the subpixels 522, 524, 528 of the second subpixel combination correspond to same hues corresponding to the subpixels 512, 514, 518 of the first subpixel combination, respectively, and the subpixel 526 of the second subpixel combination corresponds to a hue that is different from a peak wavelength corresponding to the subpixel 516 of the first subpixel combination (e.g., the subpixel 522 has a peak wavelength that is the same as that of the subpixel 512, the subpixel 524 has a peak wavelength that is the same as that of the subpixel 514, the subpixel 528 has a peak wavelength that is the same as that of the subpixel 518, and the subpixel 526 has a peak wavelength that is the same as that of the subpixel 516). Alternatively, the subpixels 522 and 528 of the second subpixel combination may correspond to hues that are distinct from hues corresponding to the subpixels 512 and 518 of the first subpixel combination (e.g., a peak wavelength corresponding to the subpixel 522 is distinct from, such as shorter than, a peak wavelength corresponding to the subpixel 512, or a peak wavelength corresponding to the subpixel 528 is distinct from, such as longer than, a peak wavelength corresponding to the subpixel 518), while, in some embodiments the subpixels 524 and 526 have hues that are identical to hues of the subpixels 514 and 516.

In some embodiments, the display device is configured to receive color information for pixels in multiple emission regions. In some embodiments, the display device is configured to cause one or more light emitters of a respective pixel to emit light based on color information for the respective pixel (e.g., the color information indicates a color that is within the respective color gamut of the respective pixel). In some embodiments, the display device is configured to obtain new color information for the respective pixel by processing the received color information so that the new color information for the respective pixel indicates a color within the respective color gamut. For example, the display device is configured to receive first color information for a pixel (e.g., the pixel 511) in the first emission region 510 and second color information for a pixel (e.g., the pixel 521) in the second emission region 520. In some embodiments, the display device is configured to, in accordance with a determination that a color indicated by the second color information is outside a color gamut for the second emission region (e.g., the second color gamut), process the second color information to obtain third color information based at least on the color gamut for the second emission region 520 (e.g., mapping a color indicated by the second color information to another color within the second color gamut). For example, the display device maps a first color indicated by the second color information to a second color that has a same hue as the first color and is within the color gamut for the second emission region 520, and prepares the third color information so that the third color information indicates the second color. The display device is configured to cause one or more light emitters (e.g., a light emitter corresponding to the subpixel 512) of the pixel in the second emission region 520 to emit light based on the third color information instead of the second color information. Alternatively, the display device is configured to cause one or more light emitters of the pixel in the first emission region 510 (e.g., the pixel 511) to emit light based on the first color information without processing the first color information (e.g., in accordance with a determination that a color indicated by the first color information is within a color gamut for the first emission region).

In some embodiments, light emitters having different luminous efficacies are arranged in different emission regions. In some embodiments, a luminous efficacy varies based on a representative color (or a hue or a peak wavelength) of a light emitter. In some cases, a luminous efficacy of a light emitter increases as the peak wavelength increases up to a particular wavelength (e.g., 540 nm), and has a maximum luminous efficacy at the particular wavelength. Then, the luminous efficacy decreases as the peak wavelength further increases above the particular wavelength. In some embodiments, a respective light emitter of the first group of two or more light emitters has a luminous efficacy that is distinct from a luminous efficacy of a respective light emitter of the third group of one or more light emitters. In some embodiments, a respective light emitter of the second group of two or more light emitters has a luminous efficacy that is distinct from a luminous efficacy of a respective light emitter of the fourth group of one or more light emitters. In some embodiments, the first emission region 510 includes a plurality of light emitters having a lower luminous efficacy (e.g., than a plurality of light emitters in the second emission region 520), and peripheral emission regions (e.g., the second emission region 520, the third emission region 530, the fourth emission region 540, etc.) includes a plurality of light emitters having a higher luminous efficacy (e.g., than a plurality of light emitters in the first emission region 510).

In some embodiments, a respective light emitter of the first group of two or more light emitters has a luminous efficacy that is less than a luminous efficacy of a respective light emitter of the third group of one or more light emitters. In some embodiments, a respective light emitter of the second group of two or more light emitters has a luminous efficacy that is less than a luminous efficacy of a respective light emitter of the fourth group of one or more light emitters. In some embodiments, the luminous efficacy of the respective light emitter is determined based on a material of the respective light emitter. In some embodiments, at least two light emitters of the plurality of light emitters in the first emission region 510, that have a same peak wavelength, have different luminous efficacies based on materials of the at least two light emitters (e.g., subpixel 511 has a first luminous efficacy and subpixel 512 has a second luminous efficacy that is distinct from the first luminous efficacy while both subpixel 511 and subpixel 512 have a same peak wavelength).

Figure 6:
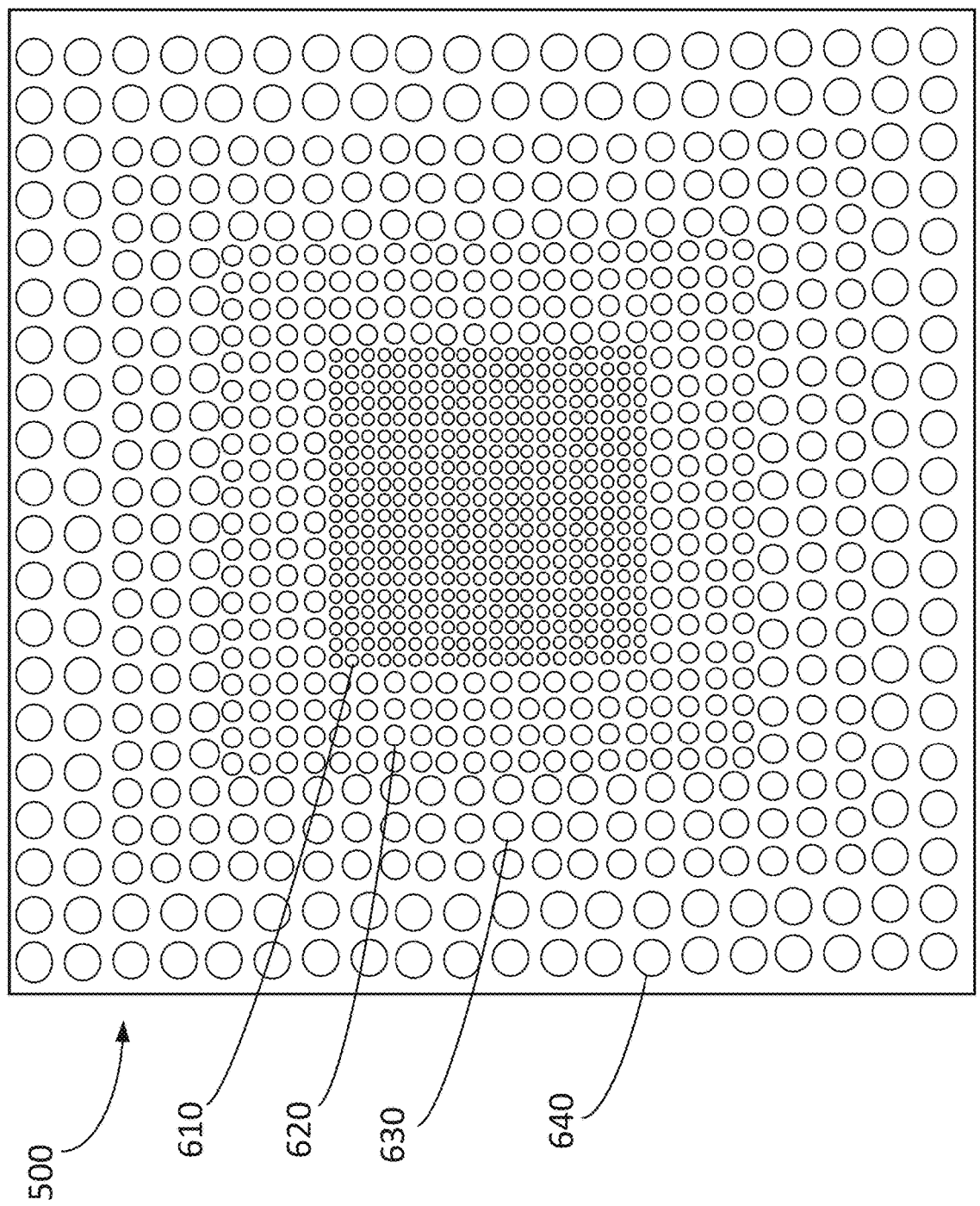
FIG. 6 illustrates a plurality of light emitters arranged in a plurality of emission regions in a display panel in accordance with some embodiments.

FIG. 6 illustrates a plurality of light emitters arranged in a plurality of emission regions in a display panel (e.g., the display panel 500 shown in FIG. 5) in accordance with some embodiments.

In some embodiments, as shown in FIG. 6, a respective emission region has a different density of light emitters. In some embodiments, a density of light emitters in an emission region is determined from a distance between adjacent (e.g., neighboring) light emitters in the emission region. Light emitters 610 are arranged in a first emission region (e.g., the first emission region 510), light emitters 620 are arranged in a second emission region (e.g., the second emission region 520), and light emitters 630 are arranged in a third emission region (e.g., the third emission region 530). Light emitters 540 are arranged in a fourth emission region (e.g., the fourth emission region 540). The first emission region is configured to provide a high resolution and high color fidelity and the other emission regions (e.g., the second emission region 520, the third emission region 530, the fourth emission region 540, etc.) are configured to provide lower resolutions than the first emission region. For example, two adjacent light emitters of light emitters 610 arranged in the first emission region are spaced apart from each other by a distance that is less than, or equal to 5 μm. Two adjacent light emitters of light emitters 620 arranged in the second emission region are spaced apart from each other by a distance of 10 μm. Two adjacent light emitters of light emitters 630 arranged in the third emission region are spaced apart from each other by a distance that is greater than 10 μm. At least two adjacent light emitters of light emitters 640 arranged in the fourth emission region are spaced apart from each other by a distance that is greater than the distance between two adjacent light emitters in the third emission region.

In some embodiments, a respective light emitter of the plurality of light emitters in at least one peripheral emission region (e.g., the second emission region 520, the third emission region 530, the fourth emission region 540, etc.) has a size that is greater than a size of a respective light emitter of the light emitters 610 in the first emission region. As shown in FIG. 6, a size of the light emitters 640 is greater than a size of the light emitters 630. The light emitter 630 has a size that is greater than a size of the light emitters 620. The light emitters 610 in the first emission region has a size that is smaller than the size of the light emitters 620.

Figure 7:
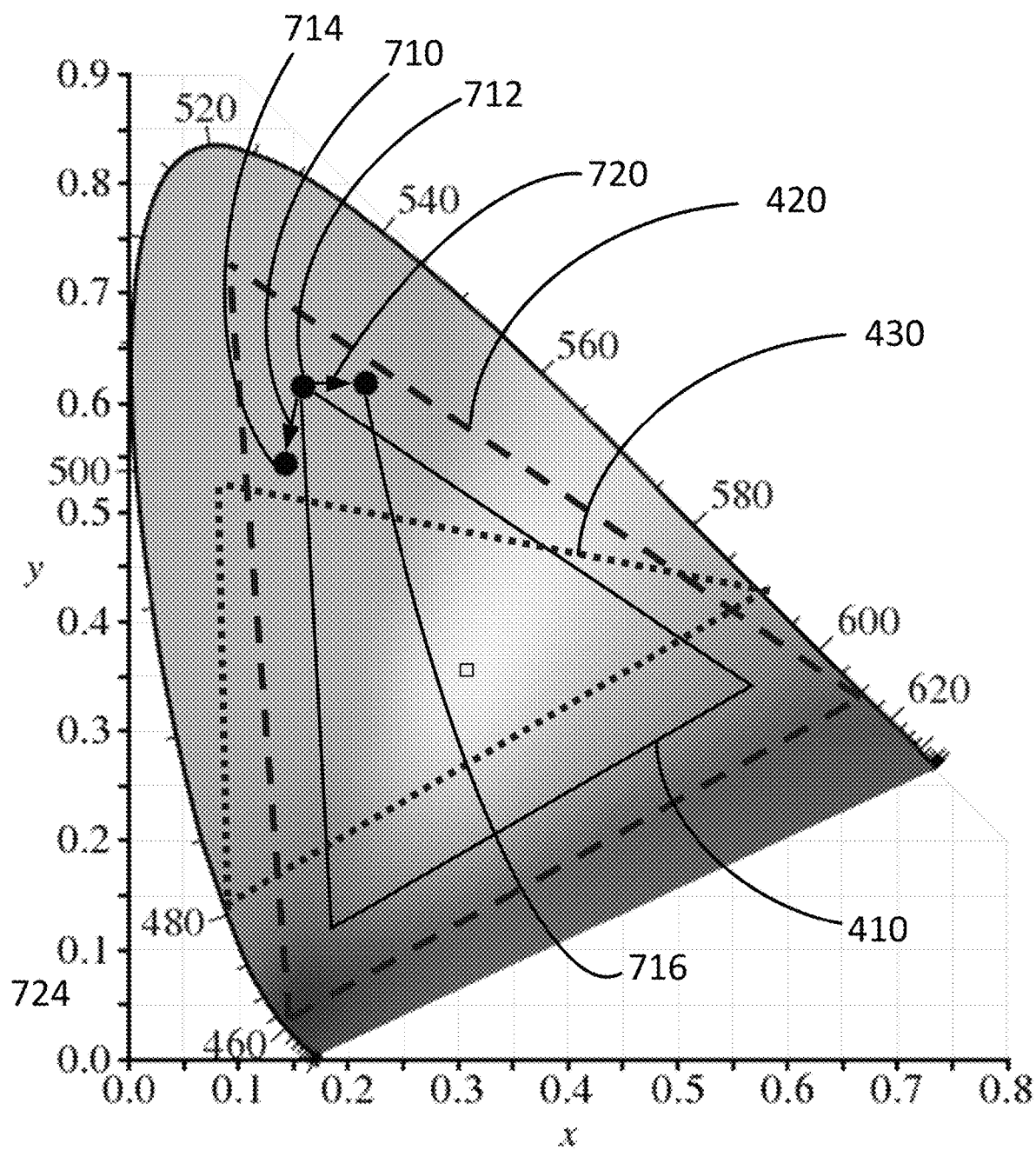
FIG. 7 illustrates a chromaticity diagram indicating a color shift in accordance with some embodiments.

FIG. 7 illustrates a chromaticity diagram indicating a color shift in accordance with some embodiments.

The chromaticity diagram illustrated in FIG. 7 is similar to the chromaticity diagram 400 illustrated in FIG. 4, except that FIG. 7 shows a color shift in some embodiments. For brevity, the detailed descriptions of the chromaticity diagram and the color gamuts described above with respect to FIG. 4 are not repeated herein.

In some embodiments, a peak wavelength of a respective light emitter shifts as a function of a current density of the respective light emitter. The peak wavelength shifts to either a shorter peak wavelength or a longer peak wavelength based on the current density of the respective light emitter. For example, a peak wavelength of a light emitter corresponding to a blue-green color shifts to a shorter peak wavelength (e.g., toward a blue color) while the light emitter is driven at a higher current density. Alternatively, the peak wavelength of the light emitter corresponding to the blue-green color shifts to a longer peak wavelength (e.g., toward a green color) while the light emitter is driven at a lower current density. In another example, a peak wavelength of a light emitter corresponding to a red color shifts to a longer peak wavelength (e.g., toward a deep red color) as the light emitter is driven at a higher current density. Alternatively, the peak wavelength of the light emitter corresponding to the red color shifts to a shorter peak wavelength (e.g., toward an orange color) while the light emitter is driven at a lower current density.

As shown in FIG. 7, an arrow 710 and an arrow 720 indicate a peak wavelength shift by changing a current density of a light emitter. A first peak wavelength of the light emitter, that operates at a first current density, corresponds to a color indicated by a point 712 in the first color gamut 410. When the light emitter is driven at a second current density, that is distinct from the first current density, the first peak wavelength shifts to a second peak wavelength that corresponds to a color indicated by a point 714. Thus, the light emitter is able to emit light corresponding to the second color gamut 420 outside the first color gamut 410 (by adjusting the current density of the light emitter). When the light emitter is driven at a third current density, that is distinct from the first current density, the first peak wavelength shifts to a third peak wavelength that corresponds to a color indicated by a point 716. Thus, the light emitter is able to emit light outside the first color gamut 410.

In some embodiments, light emitters in different emission regions (e.g., the first emission region 510, the second emission region 520, the third emission region 530, the fourth emission region 540, etc.) of a display panel (e.g., the display panel 500 shown in FIG. 5) operate at different current densities to provide colors of different color gamuts. In some embodiments, a respective light emitter of the first group of two or more light in a first emission region (e.g., the first emission region 510) operates at a first current density (e.g., $N_1$ A/cm$^2$). In some embodiments, a respective light emitter of the third group of one or more light emitter in a second emission region (e.g., the second emission region 520) operates at a second current density $N_2$ A/cm$^2$ that is distinct from the first current density. In some embodiments, $N_1$ is less than $N_2$ (e.g., by 50%, 30%, 20%, or 10% of $N_2$).

In some embodiments, the display panel (e.g., the display panel 500 shown in FIG. 5) is configured to adjust a current density for at least one light emitter. In some embodiments, the display panel is configured to provide a first current density for the first group of two or more light emitters in the first emission region (e.g., the first emission region 510) and the display panel is configured to provide, for the third group of two or more light emitters in the second emission region, the second current density at a first time and a third current density that is distinct from the second current density at a second time that is distinct from the first time.

In some embodiments, the display panel is configured to provide different current densities for at least two light emitters having different representative colors (e.g., peak wavelengths) in a same emission region. In some embodiments, the display panel is configured to provide a first current density for the first group of two or more light emitters having the first representative color (e.g., a first peak wavelength) in the first emission region (e.g., the first emission region 510) and provide a second current density, that is distinct from the first current density, for the second group of two or more light emitters having the second representative color (e.g., a second peak wavelength) in the first emission region.

In some embodiments, in order to reduce fabrication and assembly complexity of the display panel, a single light emitter (or light emitters of a same type) is used to provide light having different peak wavelengths (e.g., the single light emitter provides light having a peak wavelength corresponding to a green color at a first time and light having a peak wavelength corresponding to a blue color at a second time that is distinct from the first time). In some embodiments, a peak wavelength of the light emitter shifts by adjusting a current density. For example, while the display panel provides a first current density to the light emitter, the light emitter emits light having a first peak wavelength (e.g., a peak wavelength corresponding to green or bluish-green color). While the display panel provides a second current density, that is distinct from the second current density, to the light emitter, the light emitter emits light having a second peak wavelength (e.g., a peak wavelength corresponding to a blue or greenish-blue color) that is distinct from the second peak wavelength. In some embodiments, the display device includes a uniform array of light emitters (e.g., light emitters of a same type arranged in an array without any interspersed light emitter of a different type). In some embodiments, a same current density is provided for the light emitters in the uniform array (so that the light emitters in the uniform array shift their peak wavelength concurrently). In some embodiments, different current densities are provided to different light emitters of the uniform array (e.g., a first current density is provided for a first subset of the light emitters of the uniform array and a second current density is provided for a second subset of the light emitters of the uniform array). In some embodiments, at least two uniform arrays (having a same configuration) are arranged in different emission regions (e.g., a first uniform array in the first emission region 510 and a second uniform array in the second emission region 520). When the display panel provides different current densities for the different emission regions, the at least two uniform arrays in the different emission regions emit light corresponding to different colors.

In some embodiments, an array of at least two light emitters has different electrical contact sizes for the at least two light emitters (e.g., a first light emitter has a first contact size and a second light emitter has a second contact size that is distinct from the first contact size). In some embodiments, when a same current is provided, a uniform array with a small electrical contact size operates at a high current density, and a uniform array with a large electrical contact size operates at a low current density. Thus, by using electrical contacts of different sizes, the current density of light emitters can be adjusted.

In some embodiments, a plurality of light emitters configured to emit light having different brightness is arranged in different emission regions. In some embodiments, a plurality of light emitters is configured to provide different brightness in different emission regions. For example, a brightness of light emitted by a plurality of light emitters in a first emission region (e.g., the first emission region 510) is distinct from a brightness of light emitted by a plurality of light emitters in a second emission region (e.g., the second emission region 520).

In some embodiments, the color gamut of light emitted by a second emission region (e.g., a peripheral region) is reduced by color gamut weighting, an example of which is described below. In some embodiments, the brightness of light emitted by the second emission region is reduced by the color gamut weighting. In some embodiments, an average brightness of light emitted by the second emission region is not reduced by the color gamut weighting.

In some cases, a brightness of light emitted by a respective pixel is represented by a white value, which is determined based on brightness values of color components of the respective pixel. In some embodiments, the white value indicates an average of brightness values of color components (e.g., a red, green, and blue of an RGB color gamut, a cyan, magenta, yellow, and black of a CMYK color gamut, etc.). In some embodiments, the brightness value varies from 0 to 255 (for a respective color component). For example, the brightness value of 0 (zero) indicates no light emitted by the light emitter corresponding to a respective color component, and the brightness value of 255 indicates a full brightness of light emitted by the light emitter corresponding to the respective color component. In some embodiments, R, G, B values are used to represent brightness values of light for three color components, red, green, and blue. R represents a brightness value of a first basic color component (e.g., a red color component), G represents a brightness value of a second basic color component (e.g., a green color component), and B represents a brightness value of a third basic color component (e.g., a blue color component). For example, the brightness value of a pure green is expressed as (0, 255, 0). In some embodiments, the white value, W, is determined using the following equation (1).

$$W = \frac{R + G + B}{3} \quad (1)$$

The reduced brightness values Rr, Gr, and Br (for the three color components) are determined based on the following equations (2):

$$Rr = W + (R - W) * Wt,$$

$$Gr = W + (G - W) * Wt,$$

$$Br = W + (B - W) * Wt \quad (2)$$

where Wt represents a weight value (e.g., 0.5), also called herein a color gamut weight value or a color gamut weight.

In some embodiments, the display device receives brightness values (or data, such as image data, from which the brightness values can be obtained for respective pixels), and for pixels in the first emission region, emits light based on the received brightness values and for pixels in the second emission region, emits light based on the reduced brightness values.

Although this example describes color gamut weighting in two discrete emission regions (e.g., the first emission region and the second emission region), analogous color gamut weighting methods can be used over three or more emission regions. In addition, analogous color gamut weighting methods can be used with gradually varying weight values, as described below.

Figure 8A:
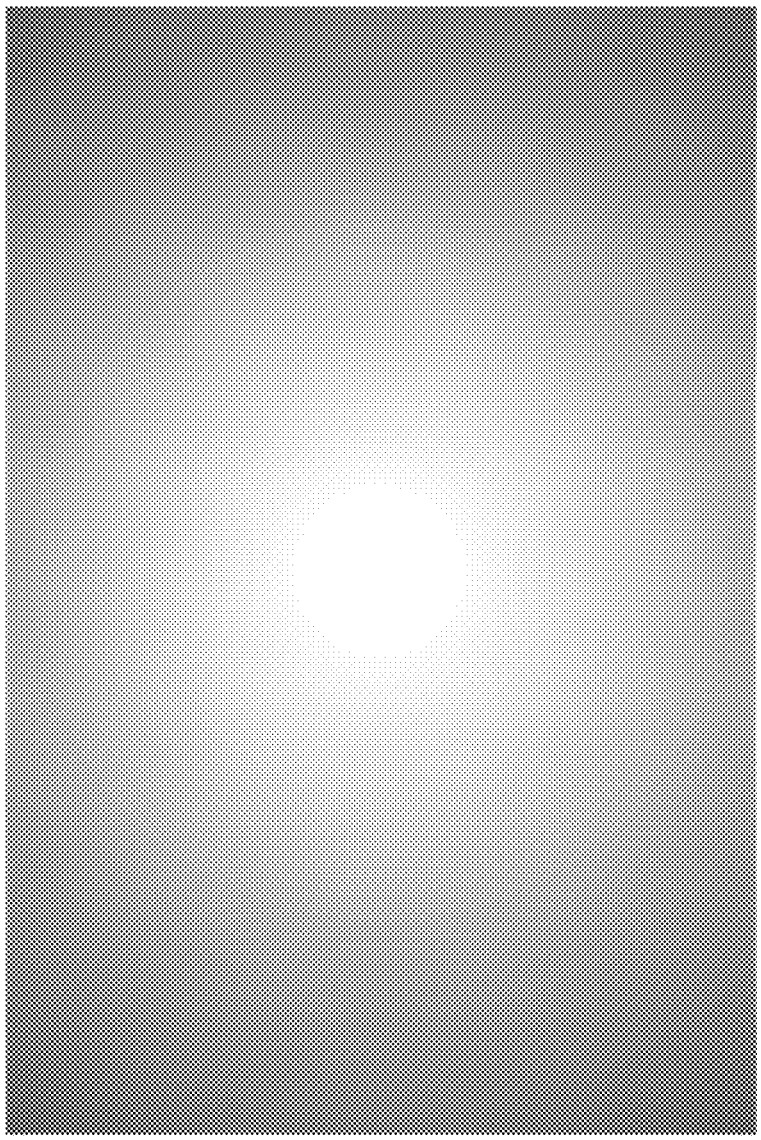
FIG. 8A represents a color gamut of light emitted from a display panel that is linearly reduced in accordance with some embodiments.

FIG. 8A represents a color gamut of light emitted from a display panel that is linearly reduced in accordance with some embodiments.

In some embodiments, the display panel (e.g., the display panel 500) includes a plurality of emission regions. In FIG. 8A, color gamut of light emitted from the display panel (depicted using the brightness of the corresponding region) varies linearly from a central region (e.g., the first emission region 510) to one or more corner regions (e.g., one or more emission region located on one or more edges of the display panel) of the display panel. In some embodiments, a high color gamut region (e.g., a center region of FIG. 8A depicted to have the highest brightness, or the first emission region 510, etc.) corresponds to a largest color gamut (e.g., the second color gamut 420) in a chromaticity diagram (e.g., the chromaticity diagram 400 in FIG. 4). In some embodiments, a low color gamut region (e.g., one or more corner regions of FIG. 8A depicted to have the lowest brightness or depicted as the darkest regions) corresponds to a smallest color gamut in the chromaticity diagram. In some embodiments, the color gamut weight value is linearly reduced from 1.0 (100% of a size of the largest color gamut) in the center to 0.0 (0% of a size of the largest color gamut) in corners. As described above, brightness values for a respective pixel (for the color components) calculated based on equations (1) and (2) are used in providing light of reduced color gamut.

Figure 8B:
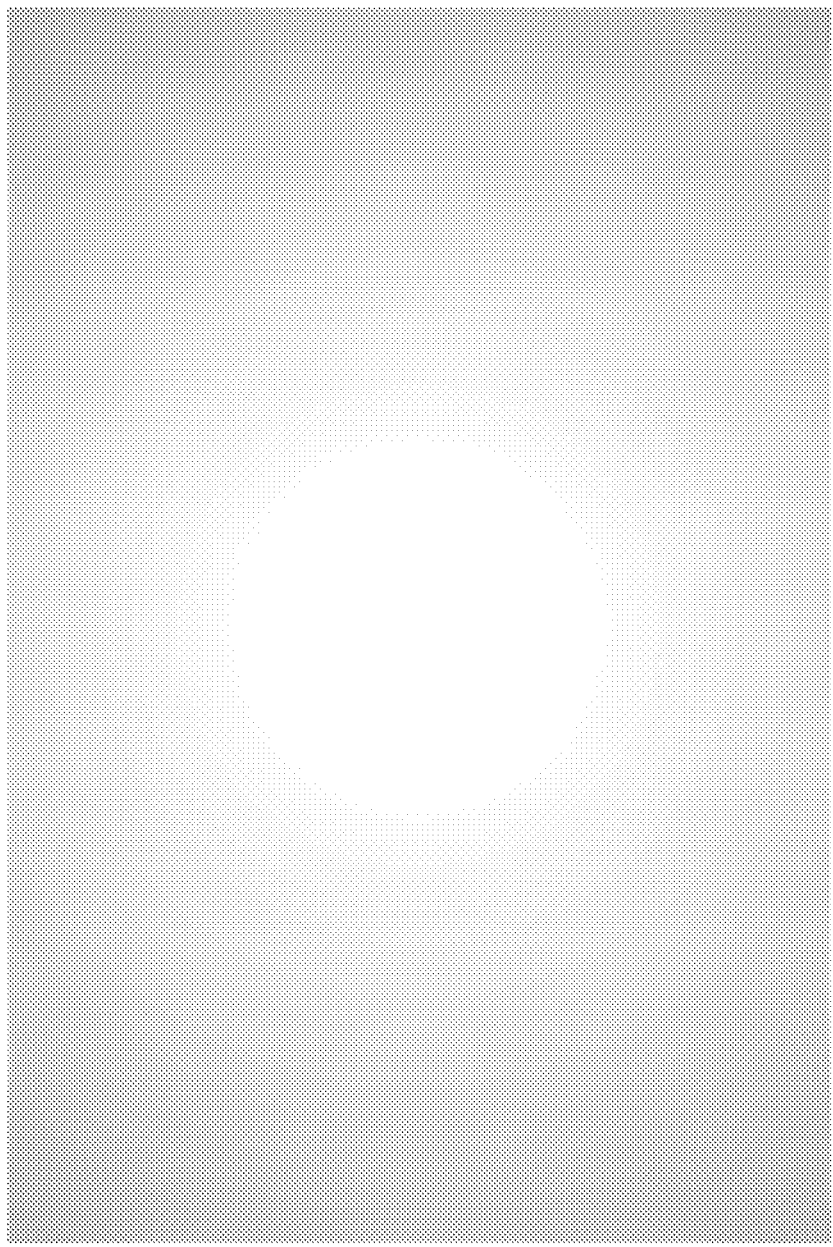
FIG. 8B represents a color gamut of light emitted from a display panel that is linearly reduced in accordance with some embodiments.

FIG. 8B represents a color gamut of light emitted from a display panel that is reduced linearly in accordance with some embodiments.

FIG. 8B is similar to FIG. 8A except that a minimum color gamut weight value is capped at 0.5. Thus, a color gamut of light emitted from the display panel (e.g., the display panel 500) varies linearly from a central region (e.g., the first emission region 510) where the color gamut weight is 1.0 to corners where the color gamut weight is 0.5.

Figure 8C:
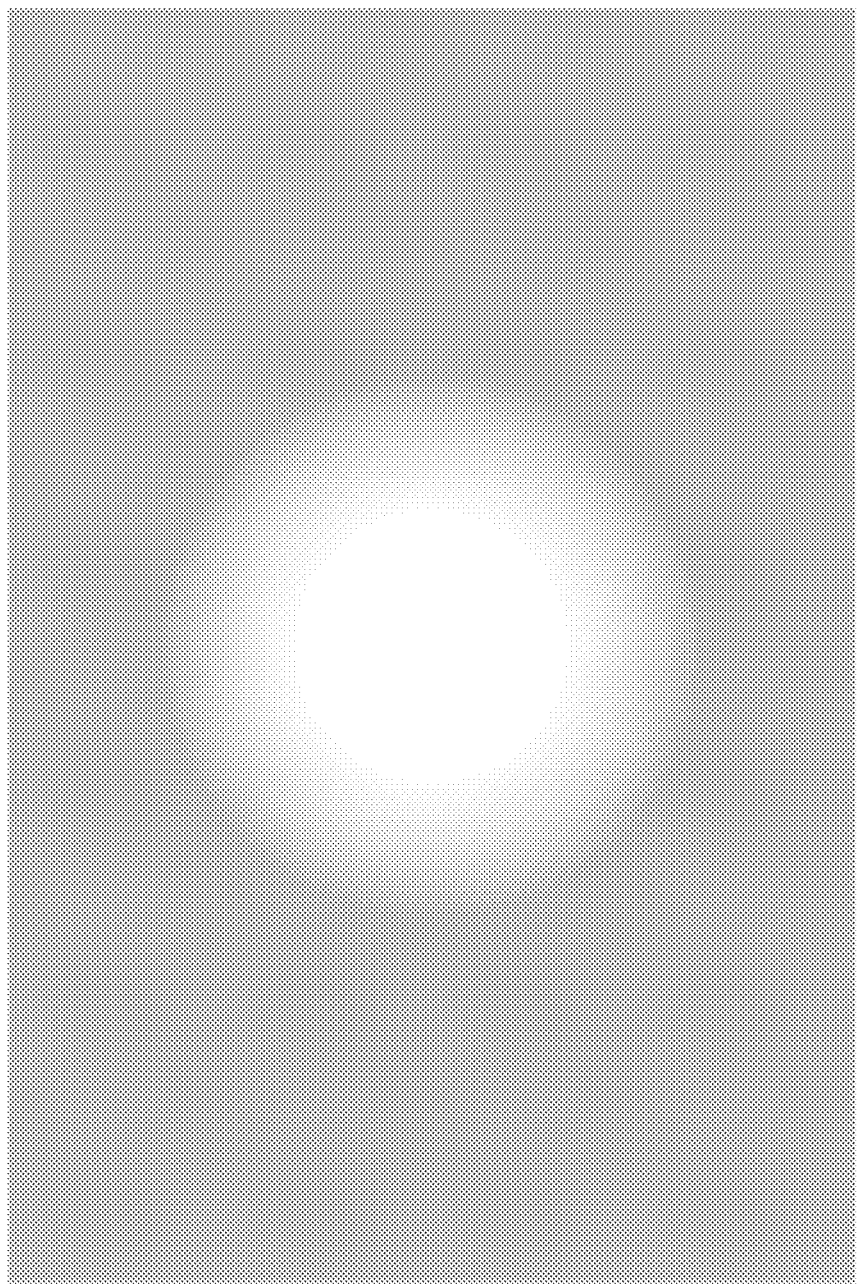
FIG. 8C represents a color gamut of light emitted from a display panel that is quadratically reduced in accordance with some embodiments.

FIG. 8C represents a color gamut of light emitted from a display panel that is quadratically reduced in accordance with some embodiments.

FIG. 8C is similar to FIG. 8B except that the color gamut is reduced quadratically (e.g., pursuant to a quadratic equation). In FIG. 8C, a minimum color gamut weight is capped at 0.5. FIG. 8C also shows that the color gamut weight is reduced to the color gamut weight of 0.5 at a location between the central region and corners (e.g., a half-way point between the center and the corners). In some embodiments, within the outer emission region (outside the locations where the color gamut weight has reached 0.5), the minimum color gamut weight is used throughout the outer emission region.

FIG. 8D represents a color gamut of light emitted from a display panel that is horizontally reduced in accordance with some embodiments.

FIG. 8D is similar to FIG. 8C except that the color gamut is reduced horizontally in FIG. 8D while FIG. 8C shows that the color gamut is reduced in radial directions from the central region.

In some embodiments, the display panel includes a plurality of emission regions. In some embodiments, a first emission region of the plurality of emission regions corresponds to a central region of the display panel in FIG. 8D that is located between one or more second emission regions that are disposed adjacent to the first emission region. In some embodiments, one or more third emission regions are disposed adjacent to the one or more second emission regions. For example, a respective second emission region of the one or more second emission regions is located between the first emission region and a respective third emission region of the one or more third emission regions. In some embodiments, the first emission region is a brightest region in the display panel that corresponds to a largest color gamut in a chromaticity diagram (e.g., the chromaticity diagram 400). As shown in FIG. 8D, a color gamut of light emitted from the display panel is reduced from the first emission region pursuant to a horizontal quadratic function.

Although the brightness is used in FIGS. 8A-8D to depict the changes in the color gamut of light emitted by pixels in various regions, in some embodiments, the average brightness of light emitted by pixels in various regions does not change by the color gamut weighting described with respect to FIGS. 8A-8D.

FIG. 8E illustrates images that are displayed on a display panel in accordance with some embodiments.

First image 800 on the left-hand side of FIG. 8E is an image without color gamut weighting, and second image 810 on the right-hand side of FIG. 8E is a corresponding image obtained by applying color gamut weighting to first image 800. In obtaining second image 810, the color gamut weighting profile described above with respect to FIG. 8B is used.

In some embodiments, a display panel includes a plurality of emission regions to provide images in different color gamuts as described above with respect to FIGS. 4-8E. FIGS. 9A-9D illustrate a display panel 900 having a two-dimensional display layout that includes a plurality of emission regions in accordance with some embodiments.

Figure 9A:
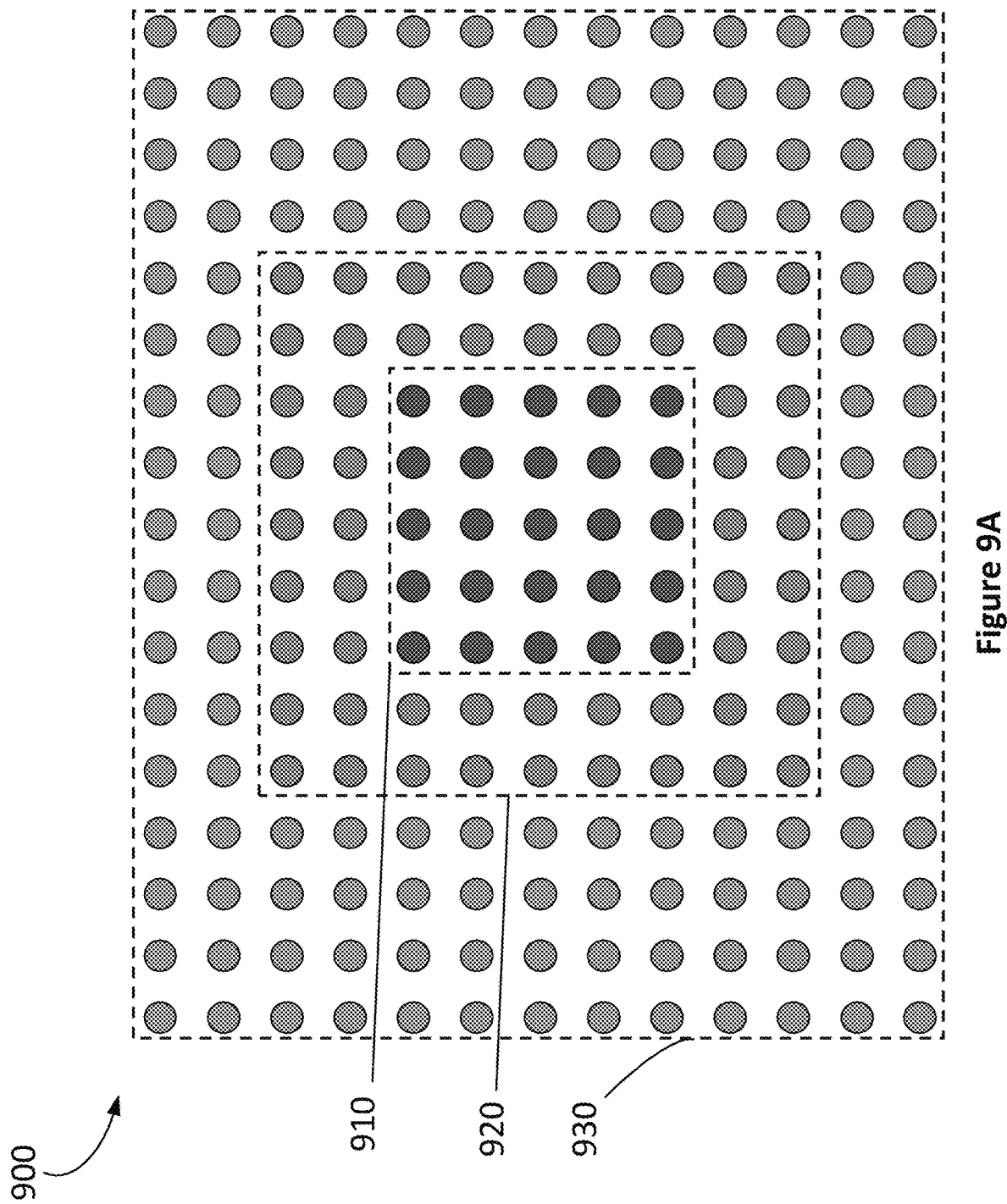
FIG. 9A illustrates a display panel having a plurality of light emitters that is configured to emit light of a uniform representative color in a respective emission region in accordance with some embodiments.

FIG. 9A illustrates the display panel 900 having a plurality of light emitters that is configured to emit light of a respective performance profile in a respective emission region in accordance with some embodiments. As shown in FIG. 9A, configuring a first emission region 910 (e.g., a center region) to provide light of a first hue profile (e.g., placing light emitters having a first peak wavelength that is close to a target peak wavelength) and configuring a second emission region 920 (e.g., a peripheral region) to provide light of a second hue profile (e.g., placing light emitters having a second peak wavelength that is further away from the target peak wavelength than the first peak wavelength) allows the use of light emitters of the second hue profile in the display panel 900 without compromising the color display quality of the display panel as perceived by the user. In some cases, a third emission region 930 (e.g., another peripheral region) is configured to provide light of a third hue profile (e.g., placing light emitters having a third peak wavelength that is further away from the target peak wavelength than the second peak wavelength).

In FIG. 9A, the display panel 900 (e.g., the display panel 500) has the two-dimensional layout that includes a first emission region 910 (e.g., that corresponds to the first emission region 510), a second emission region 920 (e.g., that corresponds to the second emission region 520), and a third emission region 930 (e.g., that corresponds to the third emission region 530). Although FIG. 9A illustrates the display panel 900 having three emission regions, the display panel 900 is not limited to having three emission regions, but rather may have fewer or more emission regions (e.g., at least 2, 3, 5, 6, or 7 regions, etc.). In FIG. 9A, a plurality of light emitters is arranged in a respective emission region of the display panel 900 with a same distance.

In some embodiments, the plurality of light emitters in the respective emission region is configured to emit light of a same color gamut. In some embodiments, a plurality of light emitters in the first emission region 910 is configured to emit light within a first color gamut.

In order to provide images in different color gamuts, a plurality of light emitters in different emission regions that corresponds to different color gamuts as described with respect to FIGS. 4-8E. In some embodiments, the plurality of light emitters in the first emission region 910 corresponds to a first color gamut. In some embodiments, a plurality of light emitters in the second emission region 920 corresponds to a second color gamut that is distinct from the first color gamut. In some embodiments, a plurality of light emitters in the third emission region 930 corresponds to a third color gamut that is distinct from the first color gamut and the second color gamut. In some embodiments, the first color gamut corresponds to a color gamut having optimal colors (e.g., a best shade of red color) for a foveal vision.

In some embodiments, the first emission region 910 includes the plurality of light emitters configured to emit light of the first wavelength, and the second emission region 920 includes a plurality of light emitters configured to emit light of a second wavelength that is distinct from the first wavelength. In some embodiments, the third emission region 930 includes a plurality of light emitters configured to emit light of a third wavelength that is distinct from the first wavelength and the second wavelength. In some embodiments, the first wavelength corresponds to a first color in the first color gamut, the second wavelength corresponds a second color in the second color gamut, and the third wavelength that corresponds a third color in a third color gamut. In FIG. 9A, the first color (e.g., red) of the first emission region 910 is distinct from the second color (e.g., orange-red) of the second emission region 920. The third color of the third emission region 930 (e.g., orange) is distinct from the first color of the first emission region 910 and the second color of the second emission region 920. As described above with respect to FIGS. 4-8E, a respective light emitter of the plurality of light emitters in the second emission region 920 has characteristics (e.g., a light emitter type, luminous efficacy, brightness, material, etc.) that are distinct from characteristics of a respective light of the plurality of light emitters in the first emission region 910. In some embodiments, the respective light emitter of the plurality of light emitters in the second emission region 920 operates at a current density that is distinct from a current density of the respective light emitter of the plurality of light emitters in the first emission region 910. For example, light emitters in the first emission region are operated at a first current density that is selected for color gamut, and light emitters in the second emission region are operated at a second current density that is selected for luminous efficacy (even through the color gamut may be degraded at the second current density). In some embodiments, a respective light emitter of the plurality of light emitters in the third emission region 930 has characteristics (e.g., a light emitter type, luminous efficacy, brightness, material, etc.) that are distinct from the characteristics of the respective light of the plurality of light emitters in the first emission region 910 and the characteristics of the respective light of the plurality of light emitters in the second emission region 920. In some embodiments, the respective light emitter of the plurality of light emitters in the third emission region 930 operates at a current density that is distinct from the current density of the respective light of the plurality of light emitters in the first emission region 910 and the current density of the respective light of the plurality of light emitters in the second emission region 920.

Figure 9B:
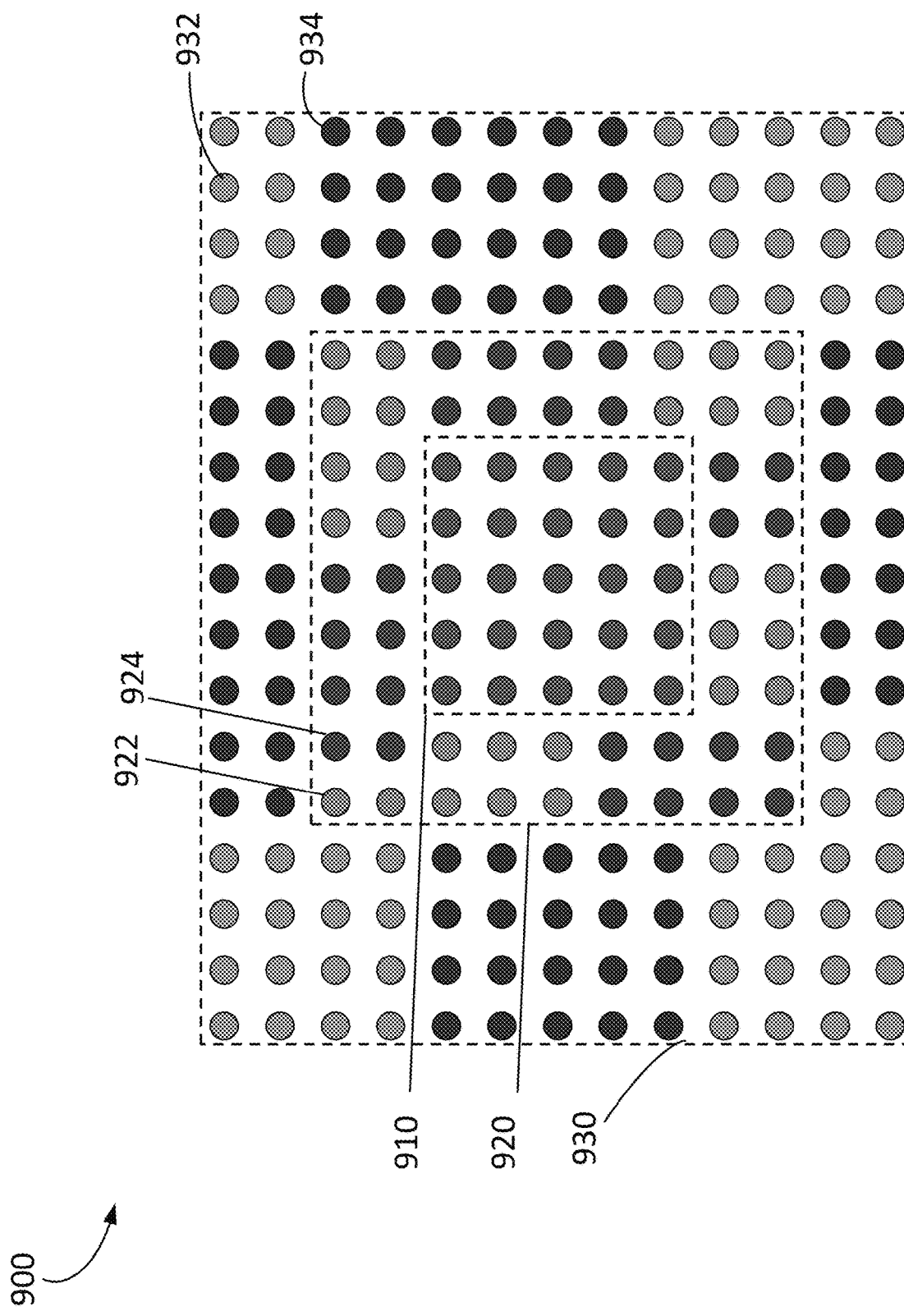
FIG. 9B illustrates a display panel having a plurality of light emitters that is configured to emit light of one or more representative colors in a respective emission region in accordance with some embodiments.

FIG. 9B illustrates the display panel 900 having a plurality of light emitters that is configured to emit light of one or more representative colors in a respective emission region in accordance with some embodiments. As shown in FIG. 9B, configuring a first emission region 910 (e.g., a center region) to provide light of a first hue profile (e.g., placing light emitters having a first peak wavelength distribution) and configuring a second emission region 920 (e.g., a peripheral region) to provide light of a second hue profile (e.g., placing light emitters having a second peak wavelength distribution that is wider than the first peak wavelength distribution, indicating that there is more variability in color of light emitted by the light emitters in the second emission region 920 than the light emitters in the first emission region 910) allows the use of light emitters of the second hue profile in the display panel 900 without compromising the color display quality of the display panel as perceived by the user. In some cases, a third emission region 930 (e.g., another peripheral region) is configured to provide light of a third hue profile (e.g., placing light emitters having a third peak wavelength distribution that is wider than the second peak wavelength distribution, indicating that there is more variability in color of light emitted by the light emitters in the third emission region 930 than the light emitters in the second emission region 920).

In FIG. 9B, the second emission region 920 has a plurality of light emitters configured to provide, for a target peak wavelength, two or more peak wavelengths that are distinct from the peak wavelength provided by light emitters in the first emission region 910.

In FIG. 9B, a plurality of light emitters configured to emit light of at least two representative colors is arranged in a respective emission region except for the first emission region 910. In some embodiments, a first group of a plurality of light emitters in the first emission region 910 is configured to emit light of a first representative color that corresponds to a first color in the first color gamut. In some embodiments, light emitted from the first emission region 910 is perceived by a fovea of an eye as having a same first color (e.g., red color). In some embodiments, the second emission region 920 includes a plurality of light emitters that is configured to emit light having at least two different colors. For example, the plurality of light emitters in the second emission region 920 includes a second group of at least one light emitter and a third group of at least one light emitter. In some embodiments, the second group of at least one light emitter (e.g., light emitter 922) is configured to emit light having a second representative color (e.g., orange) that is distinct from the first representative color, and the third group of at least one light emitter (e.g., light emitter 924) that is configured to emit light having a third representative color (e.g., orange-red) that is distinct from the first representative color and the second representative color. In some embodiments, light emitters of the second group are interspersed with light emitters of the third group in the second emission region 920. In some embodiments, the second representative color and the third representative color are within the second color gamut.

In some embodiments, the third emission region 930 includes a plurality of light emitters that is configured to emit light having at least two different representative colors. For example, the plurality of light emitters includes a fourth group of at least one light emitter and a fifth group of at least one light emitter. In some embodiments, the fourth group of at least one light emitter (e.g., light emitter 932) is configured to emit light having a fourth representative color (e.g., yellow-orange) that is distinct from the first representative color, the second representative color, and the third representative color. In some embodiments, the fifth group of at least one light emitter (e.g., light emitter 934) that is configured to emit light having a fifth representative color (e.g., orange-brown) that is distinct from the first representative color, the second representative color, the third representative color and the fourth representative color. In some embodiments, light emitters of the fourth group are interspersed with light emitters of the fifth group.

In some embodiments, the respective light emitter of the plurality of light emitters in the third emission region 930 operates at a current density that is distinct from the current density of the plurality of light emitters in the first emission region 910 and the current density of the plurality of light emitters in the second emission region 920.

Figure 9C:
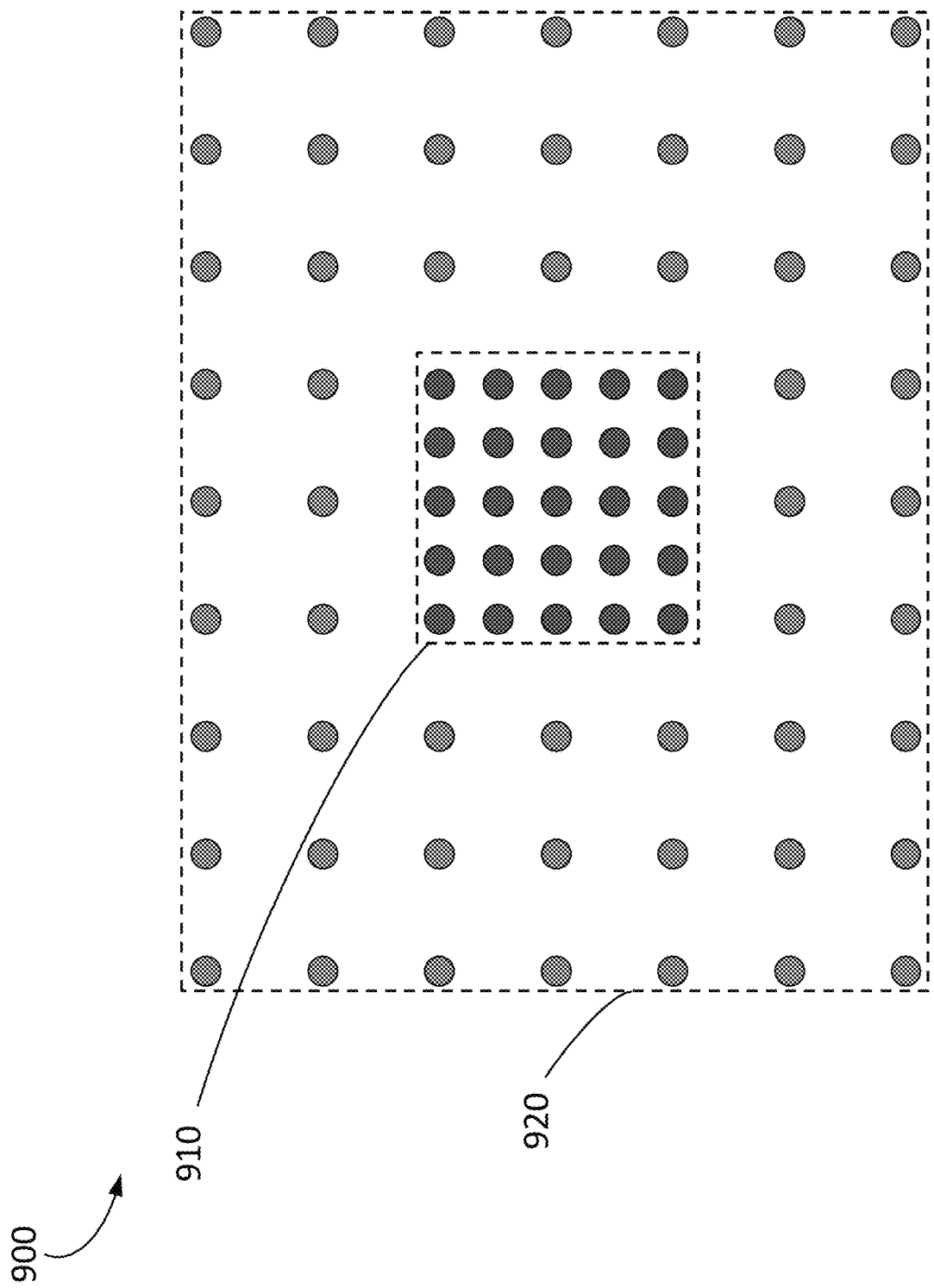
FIG. 9C illustrates a display panel having a plurality of emission regions with different densities of a plurality of light emitters in accordance with some embodiments.

FIG. 9C illustrates the display panel 900 having a plurality of emission regions with different densities of a plurality of light emitters in accordance with some embodiments.

FIG. 9C is similar to FIG. 9A except that the first emission region 910 and the second emission region 920 have different densities of light emitters. As shown in FIG. 9C, a distance between two adjacent light emitters in the second emission region 920 is greater than a distance between two adjacent light emitters in the first emission region 910. In some embodiments, a size of a respective light emitter of the plurality of light emitters in the second emission region 920 is greater than, or equal to a size of a respective light emitter of the plurality of light emitters in the first emission region 910. For brevity, the detailed descriptions of the plurality of light emitters in a respective emission region as described above with respect to FIG. 9A are not repeated herein.

Figure 9D:
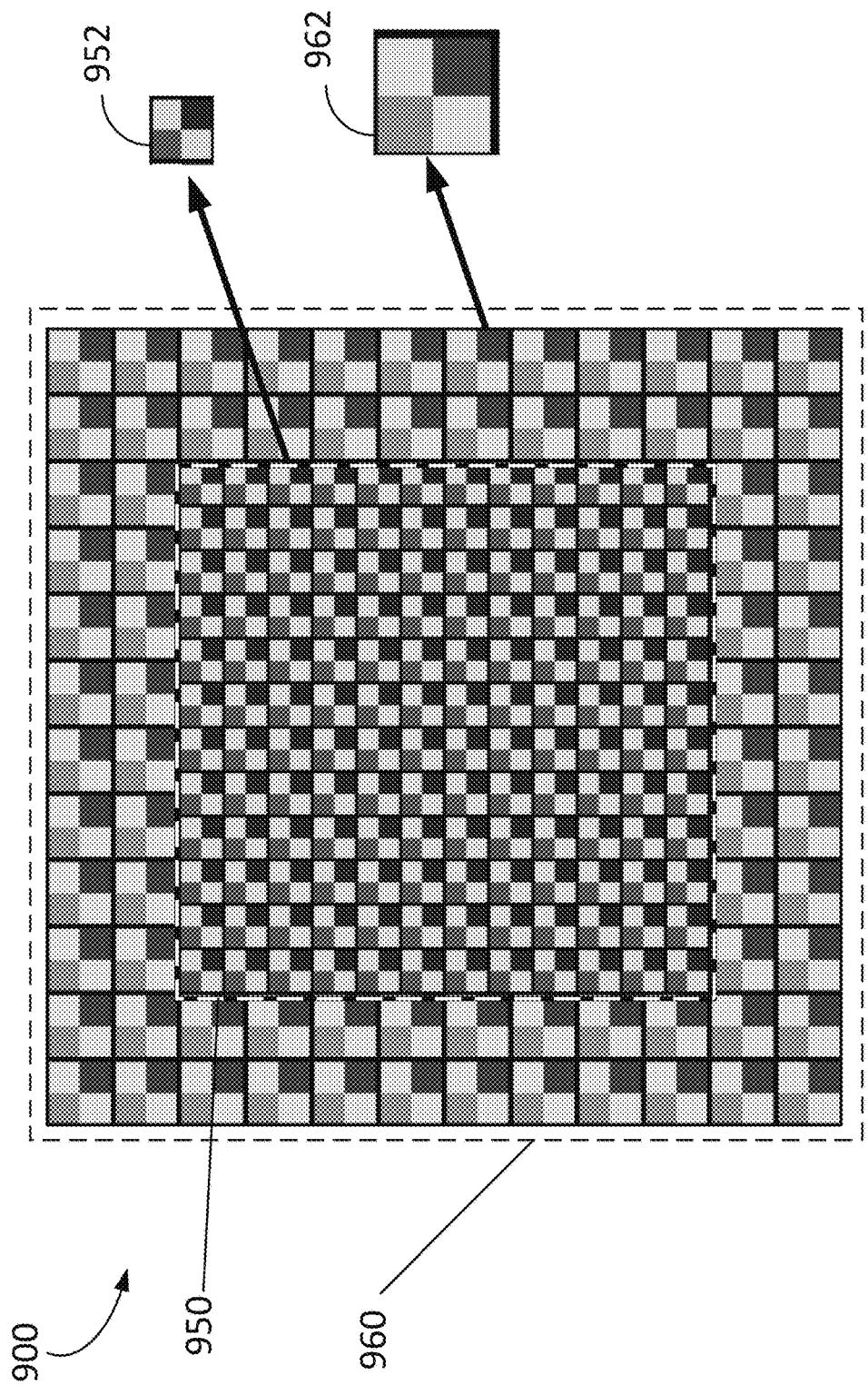
FIG. 9D illustrates subpixels of a display panel in accordance with some embodiments.
Figure 9E:
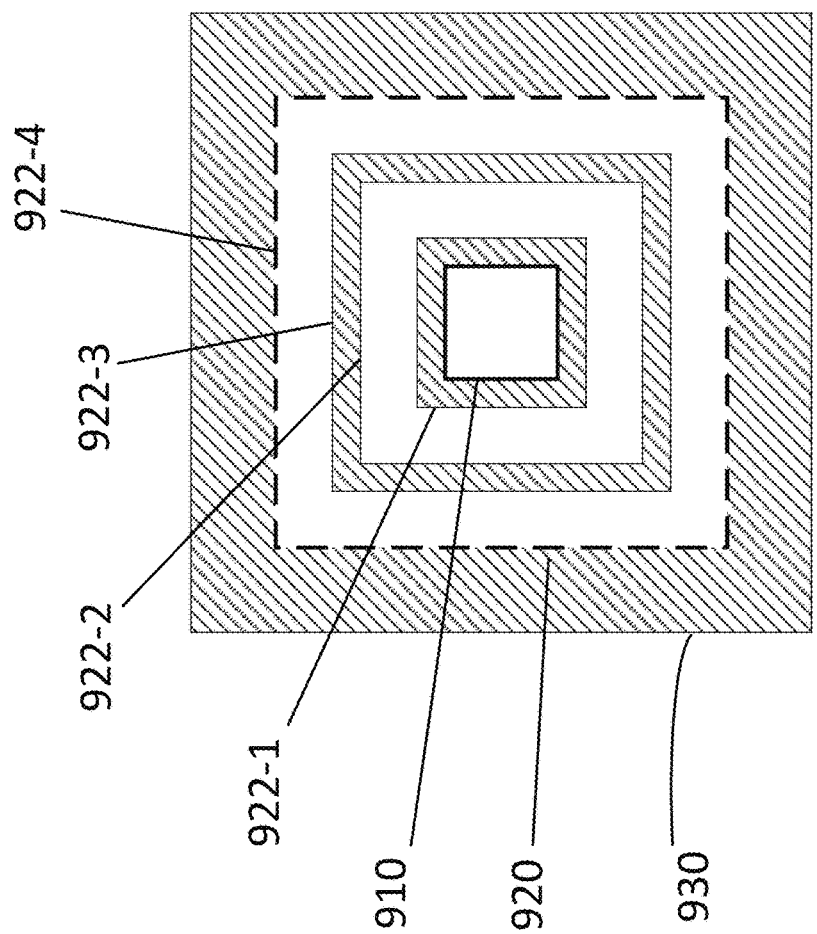
FIGS. 9E and 9F illustrate display panels in accordance with some embodiments.
Figure 9F:
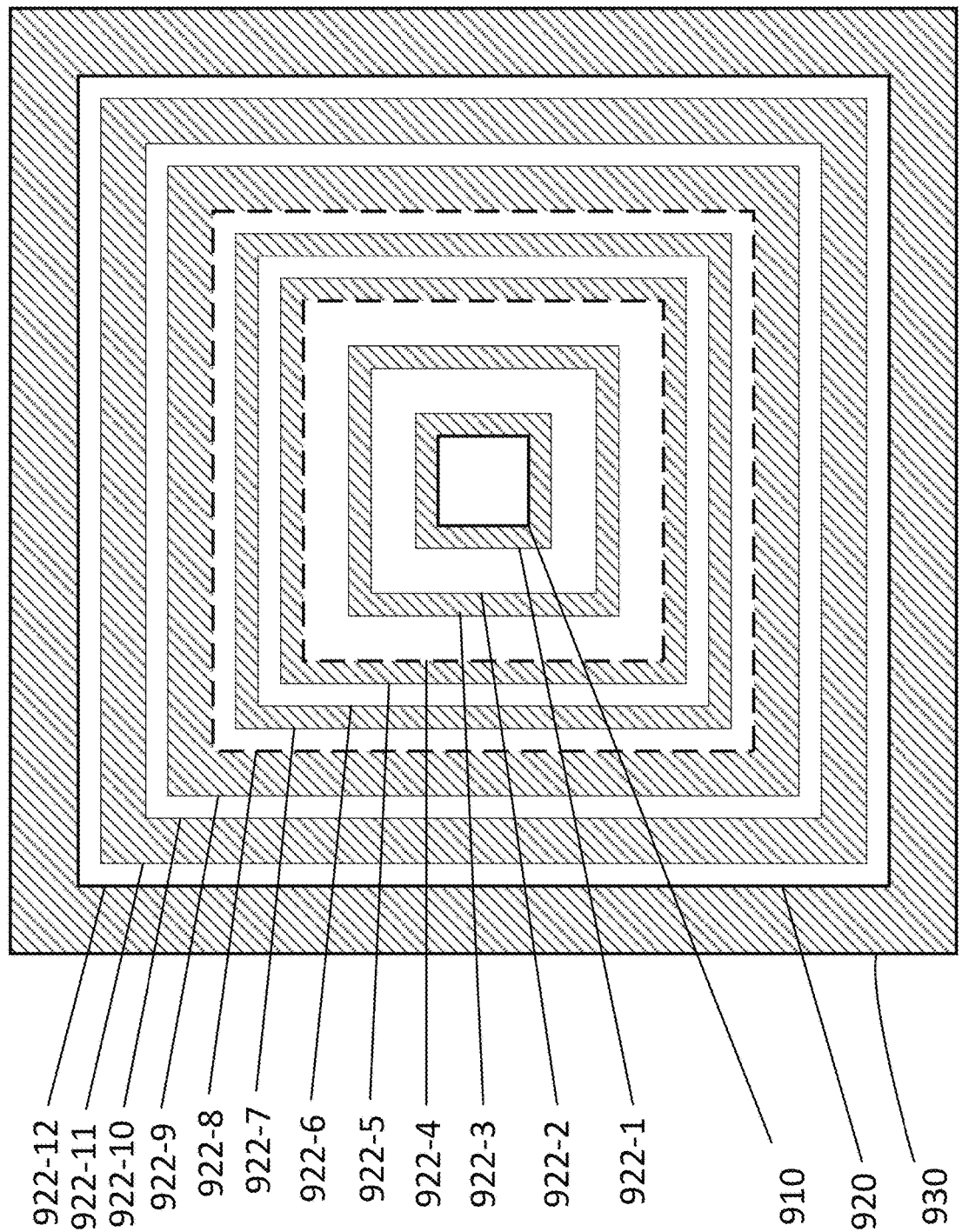

FIG. 9D illustrates a plurality of pixels of the display panel 900 in accordance with some embodiments.

In FIG. 9D, a size of a respective light emitter of the plurality of light emitters in a peripheral emission region 960 (e.g., the second emission region 920, the third emission region 930, etc.) is greater than a size of a respective light emitter of the plurality of light emitter in a central emission region 950 (e.g., the first emission region 910) of the display panel. In some embodiments, as shown in FIG. 9D, a pixel in the peripheral emission region 960 is larger than a pixel in the central emission region 950. In some embodiments, as shown in FIG. 9D, subpixels in the peripheral emission region 960 are larger than subpixels in the central emission region 950. In FIG. 9D, item 952 is an enlarged view of a respective pixel of a plurality of pixels in the first emission region 950, and item 962 is an enlarged view of a respective pixel of a plurality of pixels in the second emission region 960. In FIG. 9D, the pixel 952 includes four subpixels (e.g., one red subpixel, two green subpixels, and one blue subpixel). In some embodiments, as shown in FIG. 9D, the pixel 962 has a same number of subpixels as the number of subpixels in the pixel 952 (e.g., four subpixels). In some embodiments, the subpixels of the pixel 952 have colors different from the colors of the four subpixels of the pixel 950 (e.g., as described above with respect to FIGS. 9A and 9B, the colors provided by the subpixels of the pixel 952 are further away from target colors than the colors provided by the subpixels of the pixel 962).

In some embodiments, a display panel has one dimensional display layout that includes a plurality of emission regions to provide images in different color gamuts. FIGS. 10A-10F illustrate a display panel 1000 having the one dimensional layout that includes a plurality of emission regions in accordance with some embodiments.

Although FIGS. 9A-9D illustrate display panels with discrete regions (or regions having discrete color gamuts), in some embodiments, a display panel with a plurality of regions having continuously varying color gamuts is used. For example, two adjacent regions having discrete color gamuts have color gamut weight values that differ by at least 0.1, whereas two adjacent regions having continuously varying color gamuts have color gamut weight values that differ by less than 0.1.

Figure 10A:
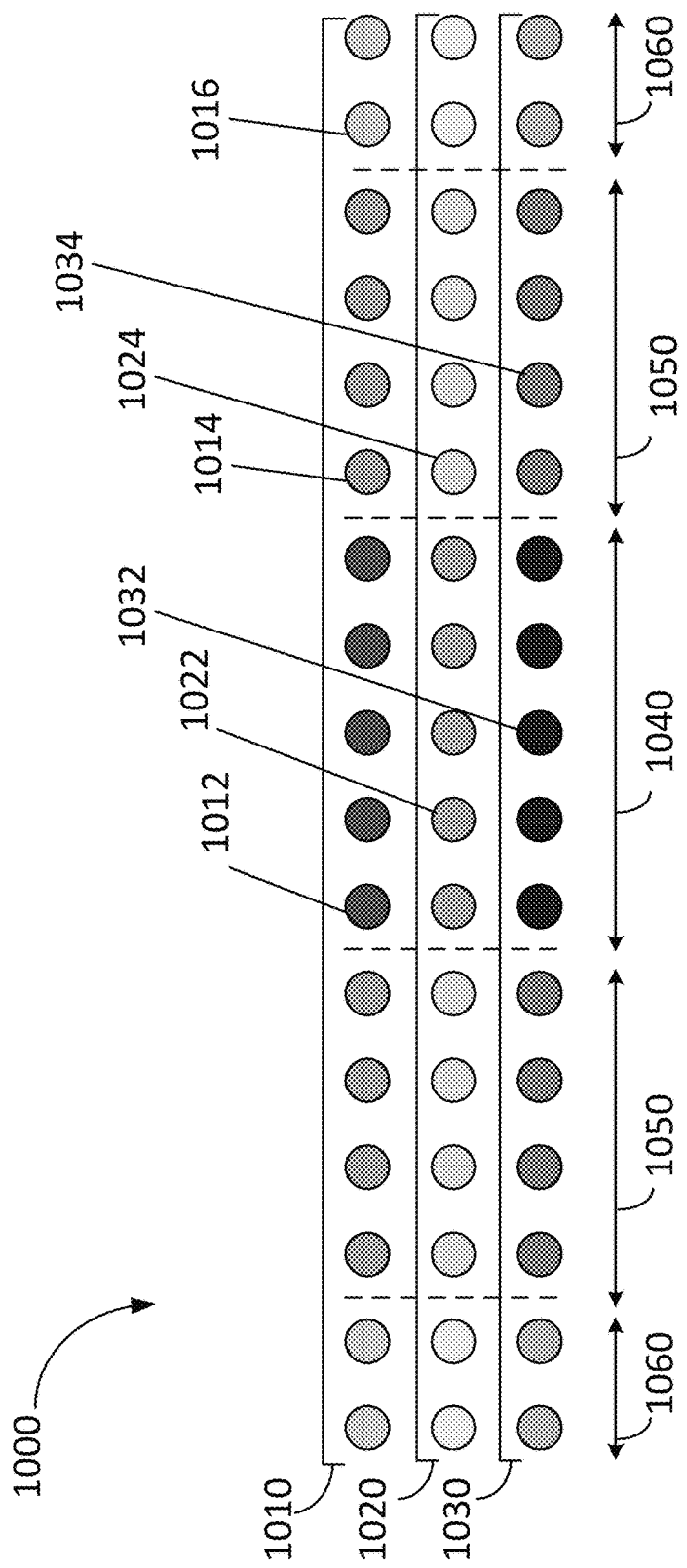
FIG. 10A illustrates a display panel having the one dimensional display layout that includes at least one linear array of a plurality of light emitters in accordance with some embodiments.

FIG. 10A illustrates the display panel 1000 having the one dimensional display layout in accordance with some embodiments.

The display panel 1000 is similar to the display panel illustrated in FIGS. 5-6 and 9A-9D except that the display panel 1000 has a one-dimensional display layout that includes at least one linear array of the plurality of light emitters (e.g., light emitters of a same color extend only along a single direction).

In FIG. 10A, the display panel 1000 includes a first emission region 1040 for a foveal vision, and one or more (e.g., two) second emission regions 1050 and one or more (e.g., two) third emission regions 1060 for a peripheral vision. In some embodiments, the display panel 1000 has additional emission regions for the peripheral vision (e.g., one or more fourth emission regions, one or more fifth emission regions, etc.). Although FIG. 10A illustrates that the number of second emission regions and third emission regions is 2, respectively, the number is not limited 2 (e.g., 3, 4, etc.). In some embodiments, the first emission region 1040 is located between the one or more second emission regions 1050. In some embodiments, a respective second emission region of the one or more second emission region 1050 is located the first emission region 1040 and a respective third emission region of the one or more third emission regions 1060. For brevity, the detailed descriptions of color gamuts and a plurality of light emitters in a respective emission region described above with respect to FIG. 5 are not repeated herein.

A plurality of light emitters arranged in the first emission region 1040 includes a first group of two or more light emitters (e.g., a light emitter 1012) having a first representative color and a second group of two or more light emitters (e.g., a light emitter 1022) having a second representative color, where the first representative color and the second representative color correspond to a first color gamut. The first representative color is distinct from the second representative color. In some embodiments, the plurality of light emitters in the one or more second emission regions 1050, that corresponds to a second color gamut, includes a third group of one or more light emitters (e.g., a light emitter 1014) having a third representative color and a fourth group of one or more light emitters (e.g., a light emitter 1024) having a fourth representative color. The third representative color is distinct from the fourth representative color. For brevity, the detailed descriptions of a respective representative color described above with respect to FIG. 5 are not repeated herein.

In some embodiments, the plurality of light emitters in the first emission region 1040 further includes a fifth group of two or more light emitters (e.g., a light emitter 1032) that has a fifth representative color. In some embodiments, the fifth representative color is distinct from the first representative color and the second representative color. In some embodiments, the plurality of light emitters in the one or more second emission regions 1050 further includes a sixth group of one or more light emitters (e.g., a light emitter 1034) that has a sixth representative color. In some embodiments, the sixth representative color is distinct from the first representative color, the third representative color, and the fourth representative color.

In some embodiments, the display panel 1000 includes a first linear array 1010, a second linear array 1020, and a third linear array 1030. Although FIG. 10A illustrates three linear arrays, the display panel 1000 may have fewer or more than three linear arrays (e.g., 1, 2 or at least 4, 5, 6 or 7 linear arrays, etc.). As shown in FIG. 10A, the second linear array 1020 is located between the first linear array 1010 and the third linear array 1030. In some embodiments, the first linear array 1010 extends in a first direction, the second linear array 1020 extends in the first direction, and the second linear array 1020 is offset from the first linear array 1010 in a second direction that is non-parallel (e.g., perpendicular) to the first direction. In some embodiments, the third linear array 1030 extends in the first direction and is offset from the first linear array 1010 and the second linear array 1020 in a third direction that is non-parallel (e.g., perpendicular) to the first direction. In some embodiments, the third direction is parallel to the second direction.

In some embodiments, at least one linear array includes at least a subset of light emitters of a plurality of light emitters arranged in different emission regions. As shown in FIG. 10A, the first linear array 1010 includes the two or more light emitters 1012 of the first group arranged in the first emission region 1040 and the one or more light emitters 1014 of the third group in the respective second emission region of the one or more second emission regions 1050. In some embodiments, the first linear array 1010 further includes one or more light emitters (e.g., a light emitter 1016) of a seventh group in the respective third emission region of the one or more third emission regions 1060 that has a seventh representative color. In some embodiments, the seventh representative color is distinct from the first representative color and the third representative color. In some embodiments, the second linear array 1020 includes the two or more light emitters 1022 of the second group in the first emission region 1040 and the one or more light emitters 1024 of the fourth group in the respective second emission region of the one or more second emission regions 1050. In some embodiments, the second linear array 1020 further includes one or more light emitters arranged in the respective third emission region of the one or more third emission regions 1060 that have a different representative color from the two or more light emitters 1022 of the second group and the one or more light emitters 1024 of the fourth group. In some embodiments, the third linear array 1030 includes the two or more light emitters 1032 of the fifth group in the first emission region 1040 and the one or more light emitters 1034 of the sixth group in the respective second emission region of the one or more three emission regions 1050. The third linear array 1030 further includes one or more light emitters arranged in the respective third emission region of the one or more third emission regions 1060 that have a different representative color from the two or more light emitters 1032 of the fifth group and the one or more light emitters 1034 of the sixth group.

As described above with respect to FIG. 6 and FIG. 9C, a respective emission region may have a different density of light emitters. In some cases, this allows providing a high region image in the first emission region 1040 and reducing power consumption in at least one peripheral emission region (e.g., the one or more second emission regions 1050, the two third emission regions 1060, etc.).

Figure 10B:
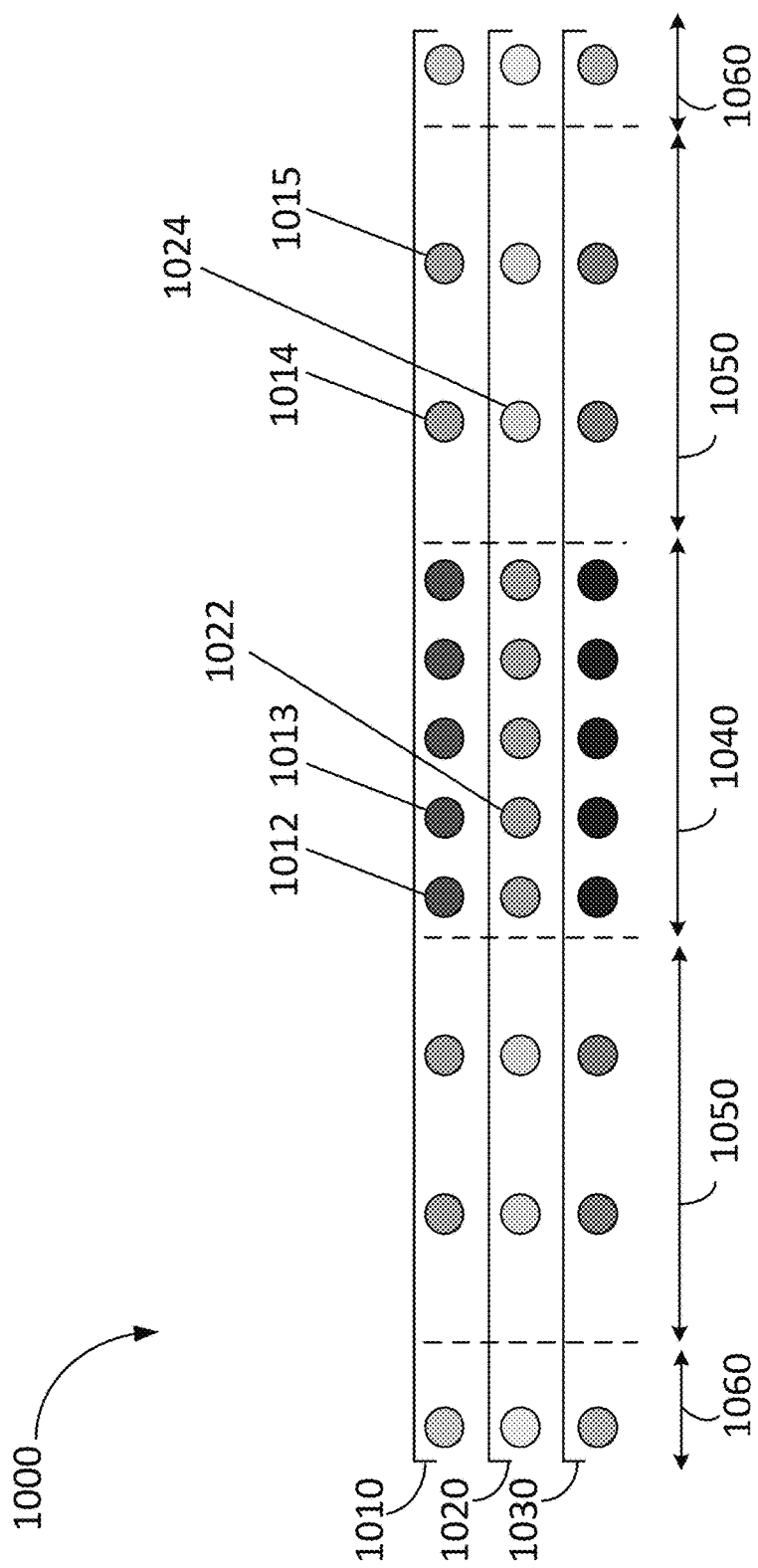
FIG. 10B illustrates a display panel having a plurality of emission regions that has a different density of a plurality of light emitters in accordance with some embodiments.

FIG. 10B illustrates the display panel 1000 having a plurality of emission regions that have different densities of light emitters in accordance with some embodiments.

FIG. 10B is similar to FIG. 10A except that the one or more second emission regions 1050, and the one or more third emission regions 1060 have different density or densities of light emitters from the density of light emitters in the first emission region 1040. In some embodiments, a density of light emitters in an emission region is determined from a distance between at least two light emitters that are adjacent to each other in the same emission region (e.g., two adjacent light emitters in a same linear array). For example, a light emitter 1012 and a light emitter 1013 of the first group of a plurality of light emitters in the first emission region 1040, that are adjacent to each other in the first linear array 1010, are spaced apart from each other by a first distance. In some embodiments, two light emitters (e.g., a light emitter 1014 and light emitter 1015) of the third group of a plurality of light emitters in a respective second emission region of the one or more second emission regions 1050, that are adjacent to each other in the first linear array 1010, are spaced apart from each other by a second distance that is distinct from the first distance. In some embodiments, the second distance is greater than the first distance. In some embodiments, a distance between the light emitter 1013 of the first group in the first linear array 1010 and a light emitter 1022 of the second group in the second linear array 1020, that are adjacent to each other in a vertical direction, is equal to a distance between the light emitter 1014 of the third group in the first linear array 1010 and a light emitter 1024 of the fourth group in the second linear array 1020. In some embodiments, as shown in FIG. 10B, a respective linear array (e.g., the first linear array 1010, the second linear array 1020, or the third linear array 1030, etc.) has a density of light emitters (or a spacing between light emitters) that varies from a center of the respective linear array corresponding to the first emission region 1040 to a left or right side of the respective linear array corresponding to edges of the display panel 1000.

Figure 10C:
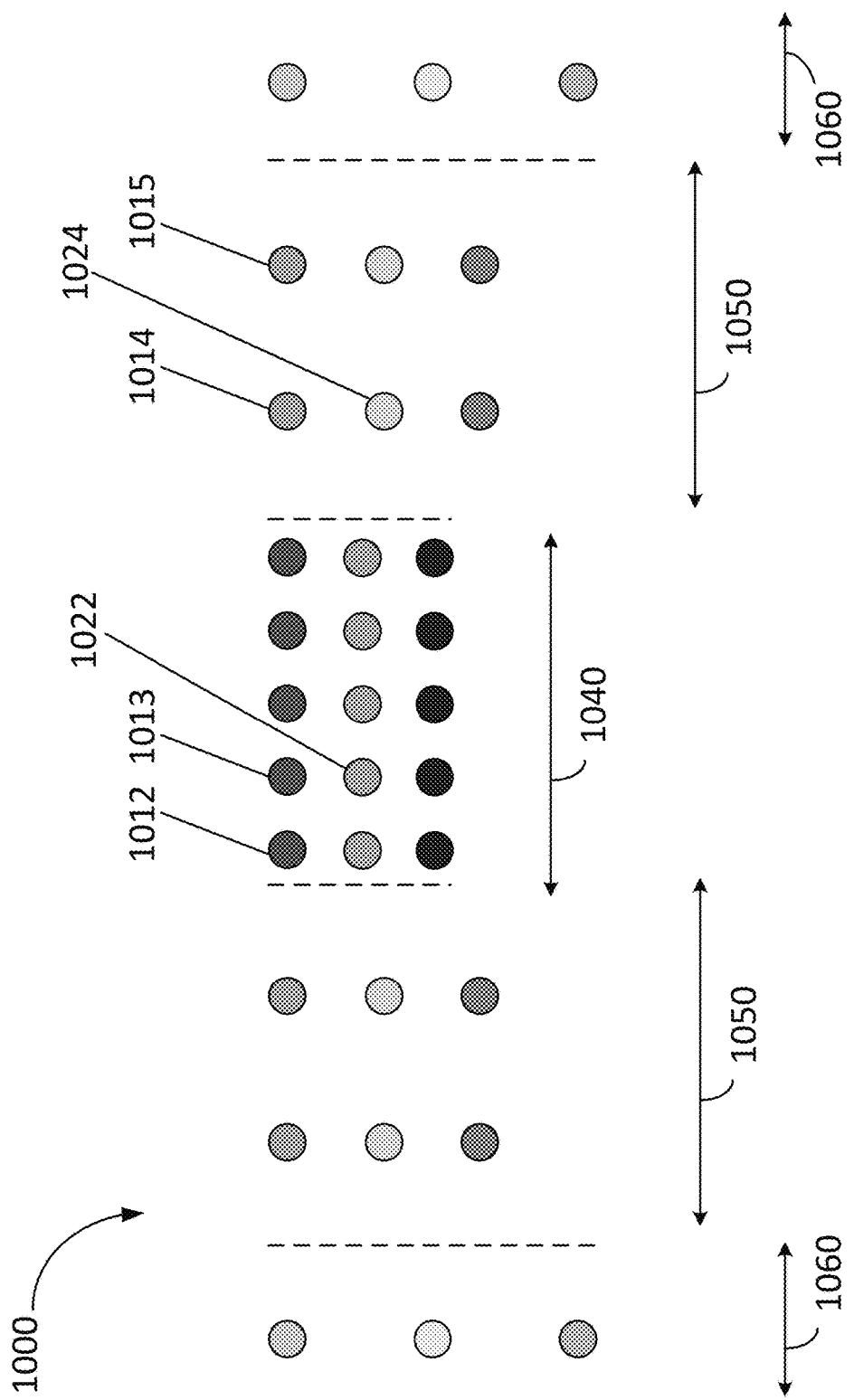
FIG. 10C illustrates a display panel having a plurality of emission regions that has a different density of a plurality of light emitters in accordance with some embodiments.

FIG. 10C illustrates the display panel 1000 having a plurality of emission regions that has a different density of a plurality of light emitters in accordance with some embodiments.

FIG. 10C is similar to FIG. 10B except that the spacing between light emitters of adjacent linear arrays differ in different emission regions.

In some embodiments, a density of light emitters in an emission region is determined from a distance between at least two light emitters that are adjacent to each other in a vertical direction (e.g., at least two light emitters in different linear arrays) and a horizontal direction (e.g., at least two light emitters in a same linear array) in the emission region (or determined from an area that is a mathematical product of the vertical distance and the horizontal distance). FIG. 10C is similar to FIG. 10B except for two adjacent light emitters in different linear arrays in a respective emission region (e.g., the light emitter 1013 in the first linear array 1010 and the light emitter 1022 in the second linear array 1020) have a different distance. As shown in FIG. 10C, the light emitter 1013 of the first group in the first linear array 1010 and the light emitter 1022 of the second group in the second linear array 1020, that are adjacent to each other in the vertical direction in the first emission region 1040, are spaced apart from each other by a first distance. In some embodiments, the light emitter 1012 and the light emitter 1013 of the first group in the first linear array 1010, that are adjacent to each other, are spaced apart from each other by the first distance. In some embodiments, the light emitter 1014 of the third group in the first linear array 1010 and the light emitter 1024 of the fourth group in the second linear array 1020, that are adjacent to each other in the vertical direction in the one or more second emission regions 1050, are spaced apart from each other by a second distance that is distinct from the first distance. In some embodiments, the light emitter 1014 and the light emitter 1015 of the third group in the first linear array 1010, that are adjacent to each other, are spaced apart from each other by the second distance. In some embodiments, the second distance is greater than the first distance. In some embodiments, a distance between at least two adjacent linear arrays (e.g., a distance between a first linear array and a second linear array, or a distance between the second linear array and a third linear array, etc.) increases from a center of the at least two adjacent linear arrays corresponding to the first emission region 1040 to a left or right side of the at least two adjacent linear arrays corresponding to edges of the display panel 1000.

Figure 10D:
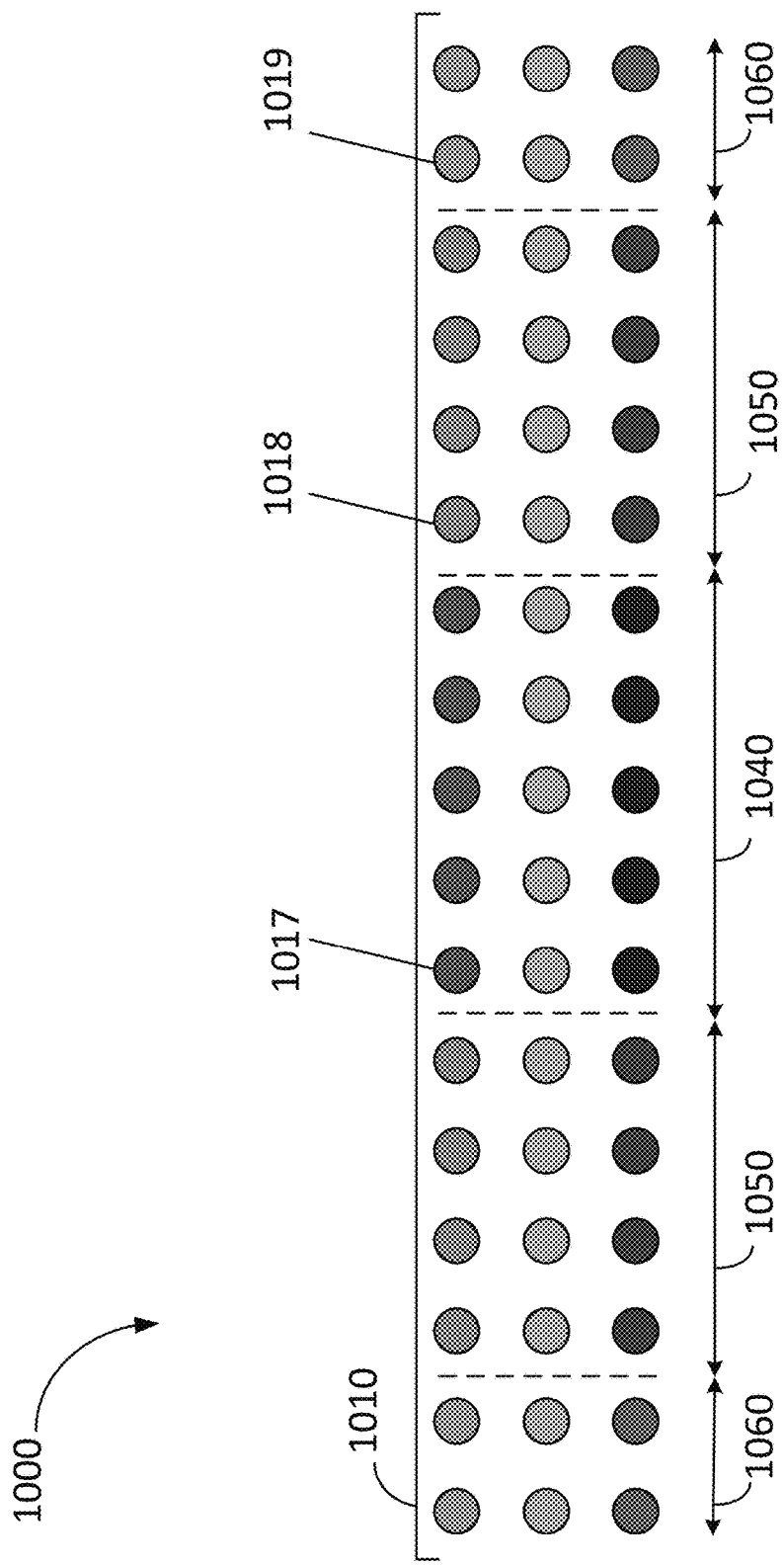
FIG. 10D illustrates a display panel having a plurality of light emitters in a respective linear layer that has different luminous efficacy in accordance with some embodiments.

FIG. 10D illustrates the display panel 1000 having a plurality of light emitters in a respective linear layer that has different luminous efficacy in accordance with some embodiments.

FIG. 10D is similar to FIG. 10A and illustrates a plurality of light emitters having different luminous efficacies that is arranged in a respective linear array (e.g., the first linear array 1010, the second linear array 1020 or the third linear array 1030, etc.). As described above with respect to FIG. 5, light emitters configured to emit light corresponding to different color gamuts have different luminous efficacies and are arranged in different emission regions. For example, in the first linear array 1010, light emitters 1017 of a plurality of light emitters in the first emission region 1040 (e.g., the first group of two or more light emitters of the first group) have a different luminous efficacy from light emitters 1018 of a plurality of light emitters in the one or more second emission regions 1050 (e.g., one or more light emitters of the third group). In some embodiments, the first linear array further includes light emitters 1018 of a plurality of light emitters in the one or more third emission regions 1060 (e.g., one or more light emitters of the seventh group) that have a luminous efficacy different from that of the two or more light emitters of the first group and the one or more light emitters of the third group.

Figure 10E:
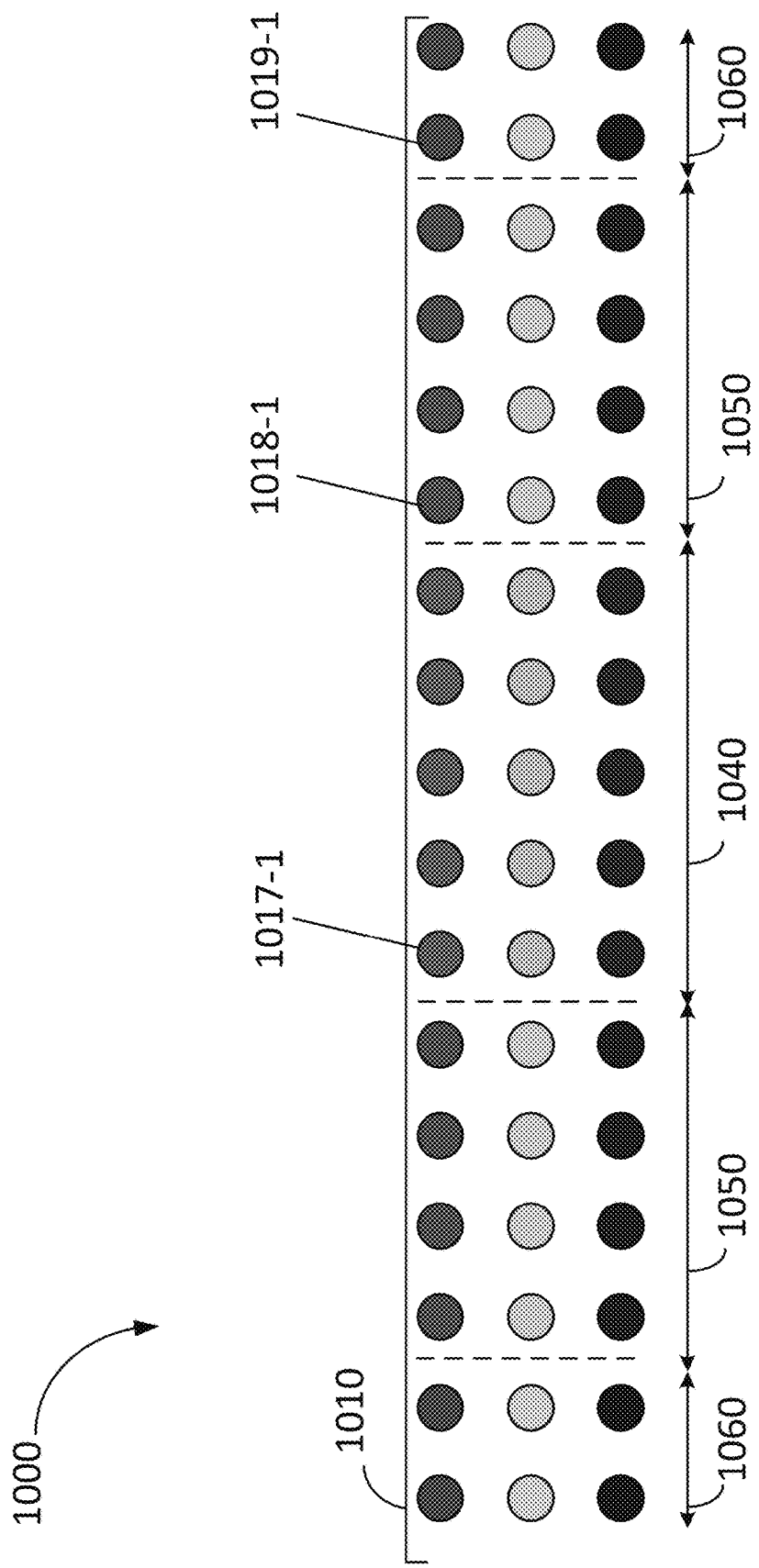
FIG. 10E illustrates a display panel having a plurality of light emitters in a respective linear layer that operates at different current densities in accordance with some embodiments.

FIG. 10E illustrates the display panel 1000 having a plurality of light emitters in a respective linear layer that operate at different current densities in accordance with some embodiments.

FIG. 10E is similar to FIG. 10A, except that FIG. 10E further illustrates a plurality of light emitters, operating at different current densities, is arranged in a respective linear array (e.g., the first linear array 1010, the second linear array 1020, or the third linear array 1030, etc.). As described above with respect to FIG. 7, a peak wavelength of a respective light emitter can shift as a function of (e.g., based on) a current density of the respective light emitter. In order to provide images in different color gamuts, a plurality of light emitters in a respective emission region operates at a respective current density. For example, light emitters 1017-1 of a plurality of light emitters in the first emission region 1040 (e.g., two or more light emitters of the first group) operate at a first current density, and light emitters 1018-1 of a plurality of light emitters in the one or more second emission regions 1050 (e.g., one or more light emitters of the third group) operate at a second current density that is distinct from the first current density. In some embodiments, light emitters 1019-1 of a plurality of light emitters in the one or more third emission regions 1060 (e.g., one or more light emitters of the seventh group) operate at a third current density that is distinct from the first current density and the second current density. As shown in FIG. 10E, the first linear array 1010 includes the light emitters 1017-1, the light emitters 1018-1, and the light emitters 1019-1 so that a current density of the first linear array 1010 varies from a center of the first linear array corresponding to the first emission region 1040 to an edge of the first linear array corresponding to edges of the display 1000.

Figure 10F:
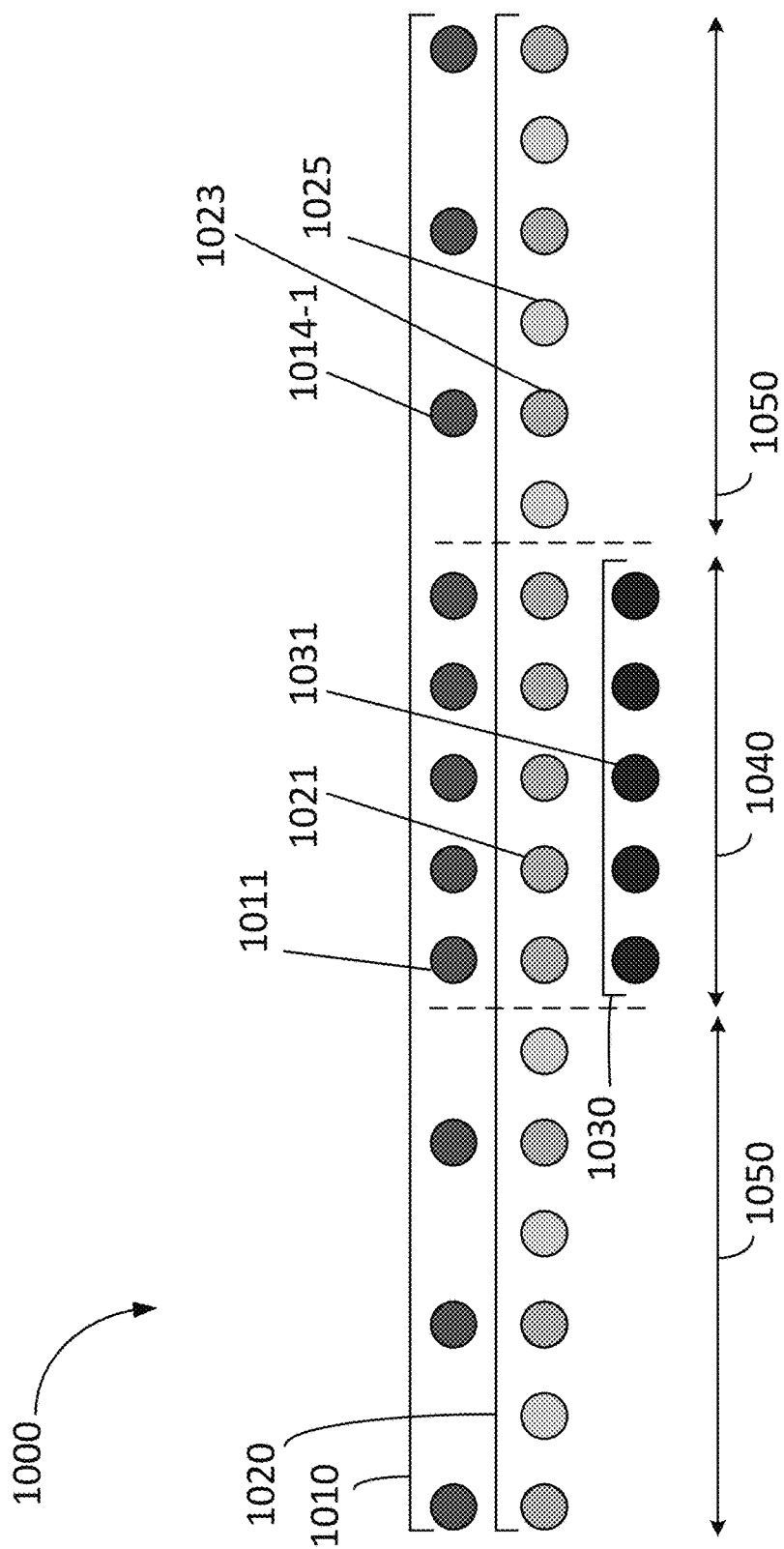
FIG. 10F illustrates a display panel having a plurality of light emitters in a respective linear layer that operates at different current densities in accordance with some embodiments.

FIG. 10F illustrates the display panel 1000 having a plurality of light emitters in a respective linear layer that operates at different current densities in accordance with some embodiments.

FIG. 10F is similar to FIGS. 10A and 10E except that a respective linear array of a plurality of linear arrays has a different arrangement of a plurality of light emitters. As described above with respect to FIG. 10E, a plurality of light emitters, that operates at different current densities, is positioned in different emission regions (e.g., the light emitters 1071-1 in the first emission region 1040 as shown in FIG. 10E). In order to improve a color foveation, at least one peripheral region (e.g., the one or more second emission regions 1050, and the one or more third emission regions 1060, etc.) has a different arrangement of a plurality of light emitters from a central emission region (e.g., the first emission region 1040). For example, a plurality of light emitters is arranged in a first configuration (e.g., having a first spacing between light emitters) in the first emission region 1040 for a foveal vision, while a plurality of light emitters is arranged in a second configuration (e.g., having a second spacing between light emitters, the second spacing being distinct from the first spacing) in the second emission region 1050. As shown in FIG. 10F, the first emission region 1040 includes the same number of light emitters arranged in a respective row (e.g., 5 light emitters 1011, 5 light emitters 1021, 5 light emitters 1031) that corresponds to a respective linear array (e.g., the first linear array 1010 in a first row, the second linear array 1020 in a second row, or the third linear array 1030 in a third row). In some embodiments, the respective second emission region of the one or more second emission regions 1050 includes the different number of light emitters arranged in a respective row (e.g., 3 light emitters 1014-1 in a first row, 6 light emitters including 3 light emitters 1023, and 3 light emitters 1025 in a second row) that corresponds to a respective linear array (e.g., the first linear array 1010, the second linear array 1020, or the third linear array 1030, etc.). As shown in FIG. 10F, light emitters 1014-1 in the first row of the one or more second emission regions 1050 are placed by a distance that is greater than a distance between two adjacent light emitters (e.g., a light emitter 1023, and a light emitter 1025) arranged in the second row of the one or more second emission regions 1050. In some embodiments, no light emitter may be arranged in the third row of the one or more second emission regions 1050.

In some embodiments, the first linear array includes the light emitters 1011 of a plurality of light emitters arranged in the first emission region 1040 (e.g., the two or more light emitters of the first group), the light emitters 1014-1 of a plurality of light emitters in the one or more second emission regions 1050 (e.g., the one or more light emitters of the third group), and at least one subset of a plurality of light emitters (e.g., the one or more light emitters of the seventh group) in the one or more third emission regions 1060. In some embodiments, the light emitters 1011 in the first emission region 1040 operate at a different current density from the light emitters 1014-1 in the one or more second emission regions 1050. Additionally, a distance between two adjacent light emitters of the light emitters 1011 in the first emission region 1040 is less than a distance between two adjacent light emitters of the light emitters 1014-1 in the one or more second emission regions 1050.

In some embodiments, the second linear array 1020 includes light emitters 1021 of the plurality of light emitters (e.g., the two or more light emitters of the second group) in the first emission region 1040, light emitters 1023 (e.g., the two or more light emitters of the fourth group) and light emitters 1025 of the plurality of light emitters in the one or more second emission regions 1050, and at least one subset of the plurality of light emitters in the one or more third emission regions 1060. In some embodiments, a representative color (e.g., the fourth representative color) of the light emitters 1023 is different from a representative color of the light emitters 1025 so that a color corresponding to light emitted by the light emitters 1023 is different from a color corresponding to light emitted by the light emitters 1025. In some embodiments, the representative color of the light emitters 1025 is equal to sixth representative color of the one or more light emitters of the sixth group as described above with respect to FIGS. 10A-10E. In some embodiments, the light emitters 1023 operates at a different current density from the light emitters 1025.

In some embodiments, the third linear array 1030 includes light emitters 1030 of the plurality of light emitters (e.g., the two or more light emitters of the fifth group) in the first emission region 1040. Although, the third linear array 1030 includes less light emitters than other linear arrays, the display panel 1000 can support the same color foveation as described with respect to FIGS. 10A-10E by adding the light emitters 1025 in the second linear array 1020.

FIG. 11 is a flow diagram illustrating a method of making a display device in accordance with some embodiments.

The method includes arranging (1100) a plurality of light emitters, that corresponds to a first color gamut, in a first emission region (e.g., the first emission region 510 in FIG. 5, the first emission region 610 in FIG. 6, the first emission region 910 in FIGS. 9A-9C, the first emission region 950 in FIG. 9D, the first emission region 1040 in FIGS. 10A-10F) of a display panel (e.g., the display panel 500 in FIGS. 5-6, the display panel 900 in FIGS. 9A-9D, the display panel 1000 in FIGS. 10A-10F) having a plurality of emission regions. The method further includes arranging (1100) a plurality of light emitters, that corresponds to a second color gamut, in one or more second emission regions (e.g., the second emission region 520 in FIG. 5, the second emission region 620 in FIG. 6, the second emission region 920 in FIGS. 9A-9C, the second emission region 960 in FIG. 9D, the one or more second emission region 1050 in FIGS. 10A-10F) of the display panel (e.g., the display panel 500 in FIGS. 5-6, the display panel 900 in FIGS. 9A-9D, the display panel 1000 in FIGS. 10A-10F). The first emission region is distinct from and mutually exclusive to the one or more second emission regions, and the one or more second emission regions are disposed adjacent to the first emission region. The first color gamut is distinct from the second color gamut as described with respect to FIG. 4.

In light of these principles, we turn to certain embodiments.

In accordance with some embodiments, a display device includes a display panel configured to project light. The display panel has a plurality of emission regions that includes a first emission region and one or more second emission regions (e.g., FIGS. 5-6, FIGS. 8A-8D, and FIGS. 10A-10F). The first emission region is distinct from and mutually exclusive to the one or more second emission regions and the one or more second emission regions are disposed adjacent to the first emission region. The display device includes a plurality of light emitters, arranged in the first emission region, corresponding to a first color gamut and a plurality of light emitters, arranged in the one or more second emission regions, corresponding to a second color gamut (e.g., FIGS. 5-6, FIGS. 8A-8D, FIGS. 10A-10F). The second color gamut is distinct from the first color gamut (e.g., FIG. 4).

In some embodiments, the plurality of light emitters, arranged in the first emission region, includes at least a first group of two or more light emitters and a second group of two or more light emitters (e.g., FIGS. 5-10F). The two or more light emitters of the first group have a first representative color and the two or more light emitters of the second group have a second representative color that is distinct from the first representative color (e.g., FIGS. 5-10F). A respective second emission region of the one or more second emission regions includes a third group of one or more light emitters and a fourth group of one or more light emitters configured to emit light (e.g., FIGS. 5-10F). The one or more light emitters of the third group have a third representative color that is distinct from the first representative color and the second representative color (e.g., FIGS. 5-10F). The one or more light emitters of the fourth group have a fourth representative color that is distinct from the first representative color and the third representative color (e.g., FIGS. 5-10F).

In some embodiments, the plurality of light emitters, arranged in the first emission region, includes a fifth group of two or more light emitters configured to emit light. The two or more light emitters of the fifth group have a fifth representative color that is distinct from the first representative color and the second representative color (e.g., FIGS. 5-10F). The respective second emission region of the one or more second emission regions includes a sixth group of one or more light emitters configured to emit light. The one or more light emitters of the sixth group have a sixth representative color that is distinct from the first representative color, the third representative color, and the fourth representative color (e.g., FIGS. 5-10F).

In some embodiments, the two or more light emitters of the first group have emission wavelengths in a first wavelength range and the two or more light emitters of the second group have emission wavelengths in a second wavelength range that is distinct from the first wavelength range (e.g., FIG. 5). The one or more light emitters of the third group have emission wavelengths in a third wavelength range and the one or more light emitters of the fourth group have emission wavelengths in a fourth wavelength range that is distinct from the third wavelength range (e.g., FIG. 5).

In some embodiments, the third wavelength range is distinct from the first wavelength range (e.g., FIG. 5).

In some embodiments, the first group of two or more light emitters corresponds to (or have) a first luminous efficacy and the third group of two or more light emitters corresponds to (or have) a second luminous efficacy that is distinct from the first luminous efficacy (e.g., FIG. 5).

In some embodiments, a respective light emitter of the first group of two or more light emitters operates at a current density that is less than a current density at which a respective light emitter of the third group of one or more light emitters operates (e.g., FIGS. 7-8D).

In some embodiments, a size of a light emitter of the plurality of light emitters in the first emission region is less than a size of a light emitter of the plurality of light emitters in the one or more second emission regions (e.g., FIG. 6).

In some embodiments, at least two adjacent light emitters of the plurality of light emitters in the first emission region are spaced apart from each other by a first distance that is less than a distance between two light emitters of the plurality of light emitters, that are adjacent to each other, in the one or more second emission regions (e.g., FIGS. 6, 9A-9D, and 10A-10F).

In some embodiments, the display panel has two second emission regions, and the first emission region is located between the two second emission regions. The two or more light emitters of the first group in the first emission region and the one or more light emitters of the third group in each second emission region are arranged to form a first linear array (e.g., FIGS. 10A-10F). The two or more light emitters of the second group in the first emission region and the one or more light emitters of the fourth group in each second emission region are arranged to form a second linear array that is distinct and separate from the first linear array (e.g., FIGS. 10A-10F).

In some embodiments, the plurality of light emitters, arranged in the first emission region, includes a fifth group of two or more light emitters configured to emit light. The two or more light emitters of the fifth group have a fifth representative color that is distinct from the first representative color and the second representative color (e.g., FIGS. 10A-10E). The respective second emission region of the one or more second emission regions includes a sixth group of one or more light emitters configured to emit light. The one or more light emitters of the sixth group have a sixth representative color that is distinct from the first representative color, the third representative color, and the fourth representative color (e.g., FIGS. 5, and 10A-10E). The two or more light emitters of the fifth group in the first emission region and the one or more light emitters of the sixth group in each second emission region are arranged to form a third linear array that is distinct and separate from the first linear array and the second linear array (e.g., FIGS. 5, and 10A-10E).

In some embodiments, the plurality of light emitters, arranged in the first emission region, includes a fifth group of two or more light emitters configured to emit light. The two or more light emitters of the fifth group have a fifth representative color that is distinct from the first representative color and the second representative color (e.g., FIGS. 5, and 10F). The respective second emission region of the one or more second emission regions includes a sixth group of one or more light emitters configured to emit light. The one or more light emitters of the sixth group have a sixth representative color that is distinct from the first representative color, the third representative color, and the fourth representative color (e.g., FIGS. 5, and 10F). The two or more light emitters of the second group in the first emission region, the one or more light emitters of the fourth group in each second emission region, and the one or more light emitters of the sixth group are arranged to form the second linear array (e.g., FIGS. 5, and 10F). The two or more light emitters of the fifth group in the first emission region are arranged to form a third linear array that is distinct and separate from the first linear array and the second linear array (e.g., FIGS. 5, and 10F).

In some embodiments, a brightness of the light emitted from the one or more second emission regions is less than a brightness of light emitted from the first emission region (e.g., FIGS. 8A-8E).

In some embodiments, the first emission region is surrounded by the one or more second emission regions (e.g., FIGS. 5-6, and 9A-9D).

In some embodiments, the first emission region includes a plurality of pixels, each pixel including two or more light emitters and the second emission region includes a plurality of pixels, each pixel including two or more light emitters (e.g., FIG. 5). The display device is configured to receive first color information for a pixel in the first emission region and second color information for a pixel in the one or more second emission regions (e.g., FIG. 5). The display device is configured to process the second color information to obtain third color information based at least on the second color gamut for the one or more second emission regions and cause one or more light emitters of the pixel in the one or more second emission regions to emit light based on the third color information instead of the second color information (e.g., FIG. 5).

In some embodiments, the display device is configured to cause one or more light emitters of the pixel in the first emission region to emit light based on the first color information (e.g., FIG. 5).

In accordance with some embodiments, a method of making a display device includes arranging a plurality of light emitters, that corresponds to a first color gamut, in a first emission region of a display panel having a plurality of emission regions and arranging a plurality of light emitters, that corresponds to a second color gamut, in one or more second emission regions of the display panel (e.g., FIG. 11). The first emission region is distinct from and mutually exclusive to the one or more second emission regions and the one or more second emission regions are disposed adjacent to the first emission region (e.g., FIGS. 5-10F). The first color gamut is distinct from the second color gamut (e.g., FIG. 4).

In accordance with some embodiments, a display device includes a display panel configured to project light. The display panel has a plurality of emission regions that includes a first emission region (e.g., region 910 in FIG. 9E), one or more second emission regions (e.g., region 920 in FIG. 9E), and one or more third emission regions (e.g., region 930 in FIG. 9E). The first emission region is distinct from and mutually exclusive to the one or more second emission regions and the one or more third emission regions. Each second emission region is distinct from and mutually exclusive to the one or more third emission regions. The one or more second emission regions are disposed adjacent to the first emission region and the one or more third emission regions. A plurality of light emitters, arranged in the first emission region, corresponding to a first color gamut. A plurality of light emitters, arranged in the one or more third emission regions, corresponding to a second color gamut that is distinct from the first color gamut. The one or more second emission regions include a first plurality of light emitters corresponding to the first color gamut and a second plurality of light emitters corresponding to the second color gamut.

In some embodiments, a respective second emission region includes a first sub-emission region (e.g., sub-emission region 922-1 in FIG. 9E), a second sub-emission region (e.g., sub-emission region 922-2 in FIG. 9E), a third sub-emission region (e.g., sub-emission region 922-3 in FIG. 9E), and a fourth sub-emission region (e.g., sub-emission region 922-4 in FIG. 9E) that are distinct from, and mutually exclusive to one another. The second sub-emission region is located between the first sub-emission region and the third sub-emission region, and the third sub-emission region is located between the second sub-emission region and the fourth sub-emission region. The second plurality of light emitters is arranged in the first sub-emission region and the third sub-emission region, and the first plurality of light emitters is arranged in the second sub-emission region and the fourth sub-emission region.

In some embodiments, the first sub-emission region, the second sub-emission region, the third sub-emission region, and the fourth sub-emission region collectively correspond to a third color gamut that is distinct from the first color gamut and the second color gamut (e.g., the average color gamut over the first sub-emission region, the second sub-emission region, the third sub-emission region, and the fourth sub-emission region is distinct from the first color gamut and the second color gamut).

In some embodiments, the respective second emission region also includes a fifth sub-emission region (e.g., sub-emission region 922-5 in FIG. 9F), a sixth sub-emission region (e.g., sub-emission region 922-6 in FIG. 9F), a seventh sub-emission region (e.g., sub-emission region 922-7 in FIG. 9F), and an eighth sub-emission region (e.g., sub-emission region 922-8 in FIG. 9F) that are distinct from, and mutually exclusive to, one another. In addition, the fifth sub-emission region, the sixth sub-emission region, the seventh sub-emission region, and the eighth sub-emission region are distinct from, and mutually exclusive to, the first sub-emission region, the second sub-emission region, the third sub-emission region, and the fourth sub-emission region. The sixth sub-emission region is located between the fifth sub-emission region and the seventh sub-emission region, and the seventh sub-emission region is located between the sixth sub-emission region and the eighth sub-emission region. The second plurality of light emitters is also arranged in the fifth sub-emission region and the seventh sub-emission region, and the first plurality of light emitters is also arranged in the sixth sub-emission region and the eighth sub-emission region.

In some embodiments, the fifth sub-emission region, the sixth sub-emission region, the seventh sub-emission region, and the eighth sub-emission region collectively correspond to a fourth color gamut that is distinct from the first color gamut, the second color gamut, and the third color gamut (e.g., the average color gamut over the fifth sub-emission region, the sixth sub-emission region, the seventh sub-emission region, and the eighth sub-emission region is distinct from the first color gamut, the second color gamut, and the third color gamut).

In some embodiments, a ratio of an area of the first sub-emission region and an area of the second sub-emission region is distinct from a ratio of an area of the fifth sub-emission region and an area of the sixth sub-emission region. For example, in some cases, the area of the first sub-emission region is smaller than the area of the second sub-emission region, and the area of the fifth sub-emission region is greater than the area of the sixth sub-emission region. In another example, the area of the first sub-emission region is smaller than the area of the second sub-emission region, and the area of the fifth sub-emission region is the same as the area of the sixth sub-emission region. In yet another example, the area of the first sub-emission region is the same as the area of the second sub-emission region, and the area of the fifth sub-emission region is greater than the area of the sixth sub-emission region.

In some embodiments, the ratio of the area of the first sub-emission region and the area of the second sub-emission region is the same as a ratio of an area of the third sub-emission region and an area of the fourth sub-emission region. In some embodiments, the ratio of the area of the fifth sub-emission region and the area of the sixth sub-emission region is the same as a ratio of an area of the seventh sub-emission region and an area of the eighth sub-emission region. In some embodiments, the ratio of the area of the first sub-emission region and the area of the second sub-emission region is distinct from the ratio of the area of the third sub-emission region and the area of the fourth sub-emission region. In some embodiments, the ratio of the area of the fifth sub-emission region and the area of the sixth sub-emission region is distinct from the ratio of the area of the seventh sub-emission region and the area of the eighth sub-emission region.

In some embodiments, the respective second emission region further includes a ninth sub-emission region (e.g., sub-emission region 922-9 in FIG. 9F), a tenth sub-emission region (e.g., sub-emission region 922-10 in FIG. 9F), an eleventh sub-emission region (e.g., sub-emission region 922-11 in FIG. 9F), and a twelfth sub-emission region (e.g., sub-emission region 922-12 in FIG. 9F) that are distinct from, and mutually exclusive to, one another. In addition, the ninth sub-emission region, the tenth sub-emission region, the eleventh sub-emission region, and the twelfth sub-emission region are distinct from, and mutually exclusive to, the first sub-emission region, the second sub-emission region, the third sub-emission region, and the fourth sub-emission region. The tenth sub-emission region is located between the ninth sub-emission region and the eleventh sub-emission region, and the eleventh sub-emission region is located between the tenth sub-emission region and the twelfth sub-emission region. The second plurality of light emitters is further arranged in the ninth sub-emission region and the eleventh sub-emission region, and the first plurality of light emitters is further arranged in the tenth sub-emission region and the twelfth sub-emission region.

In some embodiments, the ninth sub-emission region, the tenth sub-emission region, the eleventh sub-emission region, and the twelfth sub-emission region collectively correspond to a fifth color gamut that is distinct from the first color gamut, the second color gamut, the third color gamut, and the fourth color gamut (e.g., the average color gamut over the ninth sub-emission region, the tenth sub-emission region, the eleventh sub-emission region, and the twelfth sub-emission region is distinct from the first color gamut, the second color gamut, the third color gamut, and the fourth color gamut).

In some embodiments, the ratio of an area of the first sub-emission region and an area of the second sub-emission region is distinct from the ratio of an area of the fifth sub-emission region and an area of the sixth sub-emission region and a ratio of an area of the ninth sub-emission region and an area of the tenth sub-emission region, and the ratio of an area of the fifth sub-emission region and an area of the sixth sub-emission region and the ratio of the area of the ninth sub-emission region and the area of the tenth sub-emission region. For example, in some cases, the area of the first sub-emission region is smaller than the area of the second sub-emission region, the area of the fifth sub-emission region is the same as the area of the sixth sub-emission region, and the area of the ninth sub-emission region is greater than the area of the tenth sub-emission region.

The foregoing description, for purpose of explanation, has been described with reference to specific embodiments.

However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A display device, comprising:
a display panel configured to project light, the display panel having a plurality of emission regions that includes a first emission region and one or more second emission regions, wherein:
the first emission region is distinct from and mutually exclusive to the one or more second emission regions;
the first emission region is surrounded by the one or more second emission regions; and
the one or more second emission regions are disposed adjacent to the first emission region;
a plurality of light emitting diodes, arranged in the first emission region, corresponding to a first color profile, the first color profile including at least two distinct colors; and
a plurality of light emitting diodes, arranged in the one or more second emission regions, corresponding to a second color profile that is distinct from the first color profile, wherein:
the plurality of light emitting diodes, arranged in the first emission region, includes at least:
a first group of two or more light emitting diodes configured to emit light, the two or more light emitting diodes of the first group having a first chromaticity; and
a second group of two or more light emitting diodes configured to emit light, the two or more light emitting diodes of the second group having a second chromaticity that is distinct from the first chromaticity; and
a respective second emission region of the one or more second emission regions includes:
a third group of one or more light emitting diodes configured to emit light, the one or more light emitting diodes of the third group having a third chromaticity that is different from, and adjacent to, the first chromaticity; and
a fourth group of one or more light emitting diodes configured to emit light, the one or more light emitting diodes of the fourth group having a fourth chromaticity that is different from, and adjacent to, the second chromaticity and distinct from the first chromaticity and the third chromaticity.

2. The display device of claim 1, wherein:
the plurality of light emitting diodes, arranged in the first emission region, includes:
a fifth group of two or more light emitting diodes configured to emit light, the two or more light emitting diodes of the fifth group having a fifth chromaticity that is distinct from the first chromaticity and the second chromaticity; and
the respective second emission region of the one or more second emission regions includes:
a sixth group of one or more light emitting diodes configured to emit light, the one or more light emitting diodes of the sixth group having a sixth chromaticity that is distinct from the first chromaticity, the third chromaticity, and the fourth chromaticity.

3. The display device of claim 1, wherein:
the two or more light emitting diodes of the first group have emission wavelengths in a first wavelength range;
the two or more light emitting diodes of the second group have emission wavelengths in a second wavelength range that is distinct from the first wavelength range;
the one or more light emitting diodes of the third group have emission wavelengths in a third wavelength range; and
the one or more light emitting diodes of the fourth group have emission wavelengths in a fourth wavelength range that is distinct from the third wavelength range.

4. The display device of claim 3, wherein the third wavelength range is distinct from the first wavelength range.

5. The display device of claim 1, wherein the first group of two or more light emitting diodes corresponds to a first luminous efficacy and the third group of one or more light emitting diodes corresponds to a second luminous efficacy that is distinct from the first luminous efficacy.

6. The display device of claim 1, wherein the display panel further includes:
the first emission region is in contact with the one or more second emission regions.

7. The display device of claim 1, wherein:
a respective light emitting diodes of the first group of two or more light emitting diodes operates at a current density that is less than a current density at which a respective light emitting diode of the third group of one or more light emitting diodes operates.

8. The display device of claim 1, wherein:
the display panel is configured to provide a first current density for the first group of two or more light emitting diodes; and
the display panel is configured to provide, for the third group of one or more light emitting diodes, a second current density at a first time and a third current density that is distinct from the second current density at a second time that is distinct from the first time.

9. The display device of claim 1, wherein a size of a light emitting diode of the plurality of light emitting diodes in the first emission region is less than a size of a light emitting diodes of the plurality of light emitting diodes in the one or more second emission regions.

10. The display device of claim 1, wherein:
at least two adjacent light emitting diodes of the plurality of light emitting diodes in the first emission region are spaced apart from each other by a first distance that is less than a distance between two light emitting diodes of the plurality of light emitting diodes, that are adjacent to each other, in the one or more second emission regions.

11. The display device of claim 1, wherein:
the display panel has two second emission regions;
the first emission region is located between the two second emission regions;
the two or more light emitting diodes of the first group in the first emission region and the one or more light emitting diodes of the third group in each second emission region are arranged to form a first linear array; and
the two or more light emitting diodes of the second group in the first emission region and the one or more light emitting diodes of the fourth group in each second emission region are arranged to form a second linear array that is distinct and separate from the first linear array.

12. The display device of claim 11, wherein:
the plurality of light emitting diodes, arranged in the first emission region, includes a fifth group of two or more light emitting diodes configured to emit light, the two or more light emitting diodes of the fifth group having a fifth chromaticity that is distinct from the first chromaticity and the second chromaticity;
the respective second emission region of the one or more second emission regions includes a sixth group of one or more light emitting diodes configured to emit light, the one or more light emitting diodes of the sixth group having a sixth chromaticity that is distinct from the first chromaticity, the third chromaticity, and the fourth chromaticity; and
the two or more light emitting diodes of the fifth group in the first emission region and the one or more light emitting diodes of the sixth group in each second emission region are arranged to form a third linear array that is distinct and separate from the first linear array and the second linear array.

13. The display device of claim 11, wherein:
the plurality of light emitting diodes, arranged in the first emission region, includes a fifth group of two or more light emitting diodes configured to emit light, the two or more light emitting diodes of the fifth group having a fifth chromaticity that is distinct from the first chromaticity and the second chromaticity;
the respective second emission region of the one or more second emission regions includes a sixth group of one or more light emitting diodes configured to emit light, the one or more light emitting diodes of the sixth group having a sixth chromaticity that is distinct from the first chromaticity, the third chromaticity, and the fourth chromaticity;
the two or more light emitting diodes of the second group in the first emission region, the one or more light emitting diodes of the fourth group in each second emission region, and the one or more light emitting diodes of the sixth group are arranged to form the second linear array; and
the two or more light emitting diodes of the fifth group in the first emission region are arranged to form a third linear array that is distinct and separate from the first linear array and the second linear array.

14. The display device of claim 1, wherein:
a brightness of the light emitted from the one or more second emission regions is less than a brightness of light emitted from the first emission region.

15. The display device of claim 1, wherein:
the first emission region includes a plurality of pixels, each pixel including two or more light emitting diodes;
the second emission region includes a plurality of pixels, each pixel including two or more light emitting diodes;
the display device is configured to receive first color information for a pixel in the first emission region and second color information for a pixel in the one or more second emission regions; and
the display device is configured to process the second color information to obtain third color information based at least on the second color profile for the one or more second emission regions and cause one or more light emitting diodes of the pixel in the one or more second emission regions to emit light based on the third color information instead of the second color information.

16. The display device of claim 15, wherein:
the display device is configured to cause one or more light emitting diodes of the pixel in the first emission region to emit light based on the first color information.

17. The display device of claim 1, wherein the first chromaticity and the second chromaticity correspond to a first color gamut and the third chromaticity and the fourth chromaticity correspond to a second color gamut that is different from the first color gamut.

18. A display device, comprising:
a display panel configured to project light, the display panel having a plurality of emission regions that includes a first emission region and one or more second emission regions, wherein:
the first emission region is distinct from and mutually exclusive to the one or more second emission regions;
the first emission region is surrounded by the one or more second emission regions; and
the one or more second emission regions are disposed adjacent to the first emission region;
a plurality of light emitters, arranged in the first emission region, corresponding to a first color profile, the first color profile including at least two distinct colors; and
a plurality of light emitters, arranged in the one or more second emission regions, corresponding to a second color profile that is distinct from the first color profile, wherein:
the plurality of light emitters, arranged in the first emission region, includes at least:
a first group of two or more light emitters configured to emit light, the two or more light emitters of the first group having a first chromaticity; and
a second group of two or more light emitters configured to emit light, the two or more light emitters of the second group having a second chromaticity that is distinct from the first chromaticity;
each light emitter of the first group of one or more light emitters and the second group of one or more light emitters corresponds to a light emitter of a particular type; and
the display panel is configured to concurrently provide (i) a first current density for the first group of one or more light emitters for emitting light of the first chromaticity and (ii) a second current density that is distinct from the first current density for the second group of one or more light emitters for emitting light of the second chromaticity.

19. A method of making a display device, the method comprising:
arranging a plurality of light emitting diodes, that corresponds to a first color profile, in a first emission region of a display panel having a plurality of emission regions, the first color profile including at least two distinct colors; and
arranging a plurality of light emitting diodes, that corresponds to a second color profile, in one or more second emission regions of the display panel, wherein:
the first emission region is distinct from and mutually exclusive to the one or more second emission regions;

the first emission region is surrounded by the one or more second emission regions; and the one or more second emission regions are disposed adjacent to the first emission region, wherein:

the first color profile is distinct from the second color profile;

the plurality of light emitting diodes, arranged in the first emission region, includes at least:
- a first group of two or more light emitting diodes configured to emit light, the two or more light emitting diodes of the first group having a first chromaticity; and
- a second group of two or more light emitting diode configured to emit light, the two or more light emitting diodes of the second group having a second chromaticity that is distinct from the first chromaticity; and a respective second emission region of the one or more second emission regions includes:
- a third group of one or more light emitting diodes configured to emit light, the one or more light emitting diodes of the third group having a third chromaticity that is different from, and adjacent to, the first chromaticity; and
- a fourth group of one or more light emitting diodes configured to emit light, the one or more light emitting diodes of the fourth group having a fourth chromaticity that is different from, and adjacent to, the second chromaticity and distinct from the first chromaticity and the third chromaticity.

* * * * *